United States Patent
Esumi et al.

(10) Patent No.: US 8,879,226 B2
(45) Date of Patent: Nov. 4, 2014

(54) HIGH SIDE SWITCH CIRCUIT, INTERFACE CIRCUIT AND ELECTRONIC DEVICE

(75) Inventors: Takashi Esumi, Kyoto (JP); Yuzo Mizushima, Kyoto (JP); Daisaku Shugo, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 473 days.

(21) Appl. No.: 13/276,606

(22) Filed: Oct. 19, 2011

(65) Prior Publication Data

US 2012/0098517 A1    Apr. 26, 2012

(30) Foreign Application Priority Data

Oct. 20, 2010  (JP) .................... 2010-235574
Oct. 22, 2010  (JP) .................... 2010-237265

(51) Int. Cl.
*H02H 3/08* (2006.01)
*H02H 9/02* (2006.01)
*H03K 17/082* (2006.01)

(52) U.S. Cl.
CPC .... *H03K 17/0822* (2013.01); *H03K 2217/0027* (2013.01); *H03K 2217/0063* (2013.01)
USPC ......................................... 361/93.7; 361/93.1

(58) Field of Classification Search
CPC .......... H02H 3/087; H02H 3/08; H02H 9/025
USPC ................................................. 361/93.7, 93.1
See application file for complete search history.

(56) References Cited

U.S. PATENT DOCUMENTS 5,903,422 A * 5/1999 Hosokawa .................... 361/93.1

FOREIGN PATENT DOCUMENTS

JP  7-11031 U  2/1995

* cited by examiner

*Primary Examiner* — Dharti Patel
(74) *Attorney, Agent, or Firm* — Fish & Richardson P.C.

(57) ABSTRACT

A high side switch circuit includes a switch electrically connected between input and output terminals, a gate control unit, and an over-current sensor unit. The over-current sensor unit includes a resistive element and a comparator. The comparator senses an over-current if a voltage of the resistive element exceeds a threshold voltage. The comparator is adjusted in advance such that the detected voltage at the time of over-current exceeds the threshold voltage. Even if accuracy of resistance value of the resistive element is not high, accuracy of detecting over-current can be improved by adjusting the comparator.

15 Claims, 17 Drawing Sheets

HIGH SIDE SWITCH CIRCUIT, INTERFACE CIRCUIT AND ELECTRONIC DEVICE

BACKGROUND OF THE INVENTION

1. Field of the Invention

The present invention relates to a high side switch circuit, an interface circuit including the high side switch circuit, and an electronic device including the interface circuit.

2. Description of the Background Art

A switch connected between a power supply and a load is generally referred to as a high side switch. If a current flowing through the high side switch becomes excessively high because of line short-circuit or failure of load, the high side switch would be damaged. In view of the foregoing, high side switch circuits including a high side switch and a protection circuit for protecting the high side switch from over-current have been proposed.

By way of example, Japanese Utility Model Laying-Open No. 7-11031 discloses a semiconductor high side switch utilizing an MOSFET (Metal Oxide Semiconductor Field Effect Transistor) as a high side switch, and an over-current protection sensor for the high side switch. Specifically, the over-current protection sensor includes a reference voltage generating circuit connected to one terminal of the MOSFET for generating a reference voltage and a comparator connected to an output terminal of the reference voltage generating circuit and the other terminal of the MOSFET. The comparator compares the on voltage of MOSFET with the reference voltage, to detect an over-current state of the MOSFET.

According to Japanese Utility Model Laying-Open No. 7-11031, the reference voltage generating circuit generates the reference voltage by dividing power supply voltage using a plurality of series-connected resistive elements. Accuracy of the reference voltage depends on the accuracy of resistance values of the resistive elements.

Japanese Utility Model Laying-Open No. 7-11031 describes that the semiconductor high side switch and the over-current protection sensor circuit are integrated into one IC (Integrated Circuit). Here, the resistive elements are formed on a semiconductor chip. Generally, however, it is difficult to attain high accuracy of resistance value of the resistive elements formed on a semiconductor chip.

As a method of improving accuracy of resistance value of a resistance circuit included in a semiconductor integrated circuit, adjustment of resistance value by fuse resistor has been known. Typically, a fuse resistor is blown by causing a large current to flow through the fuse resistor. This adjusts the resistance value of the resistance circuit. Considering the possibility of fuse resistor blowing, however, it is difficult to place a fuse resistor in a path through which a relatively large current flows.

Japanese Utility Model Laying-Open No. 7-11031 further describes detection of an over-current state of the MOSFET. Japanese Utility Model Laying-Open No. 7-11031, however, does not specifically describe protection of the semiconductor high side switch when an over-current is detected. Further, if an over-current flows through the semiconductor high side switch, protection of circuitry including the load and power supply connected to the high side switch must also be considered. Japanese Utility Model Laying-Open No. 7-11031, however, does not disclose any specific configuration to solve such a problem.

An object of the present invention is to provide a high side switch circuit enabling improved accuracy of detecting over-current in the high side switch, as well as a device including the high side switch circuit.

Another object of the present invention is to provide a high side switch circuit capable of protecting not only the high side switch but also circuitry connected to the high side switch if an over-current in the high side switch is detected, as well as to provide a device including the high side switch circuit.

SUMMARY OF THE INVENTION

According to an aspect, the present invention provides a high side switch circuit including: an input terminal for receiving a current supplied from a power supply; an output terminal for supplying the current to a load; a first switch; a resistive element; and a sensor circuit. The first switch is electrically connected between the input terminal and the output terminal. The resistive element includes a first terminal electrically connected to the input terminal and a second terminal electrically connected to the output terminal. The sensor circuit receives a detection voltage generated at the resistive element as the current flows between the input terminal and the output terminal, for sensing that the current is an over-current, when the current reaches an over-current level and the detection voltage exceeds a threshold voltage. The sensor circuit includes an adjustment circuit. The adjustment circuit adjusts in advance the detection voltage such that the detection voltage exceeds the threshold value if the current is at an over-current level.

Preferably, the sensor circuit is a comparator for comparing the detection voltage with the threshold voltage. The adjustment circuit is configured to adjust offset of an input voltage of the comparator, for adjusting the detection voltage.

Preferably, the comparator includes a differential unit and a plurality of transistors. The differential unit changes its output voltage, in accordance with a voltage difference between a voltage at the first terminal of the resistive element and a voltage at the second terminal of the resistive element. The plurality of transistors are connected in parallel with the differential unit, for changing relation between the voltage difference and the output voltage, by adjusting current flowing through the differential unit. The adjustment circuit includes a fuse resistor connected to a corresponding one of the plurality of transistors.

Preferably, the high side switch circuit includes: a pad connected to the second terminal, allowing measurement of a voltage at the second terminal of the resistive element by a measurement device; a second switch arranged between the second terminal of the resistive element and the output terminal; and a switch control unit. The switch control unit sets both the first and second switches on when the current is supplied from the power supply to the load, and sets both the first and second switches off when the measurement device measures the voltage at the second terminal.

According to another aspect, the present invention provides an interface circuit for supplying a current from a power supply to a load. The interface circuit includes a circuit board and a high side switch circuit mounted on the circuit board. The high side switch circuit includes an input terminal for receiving the current supplied from the power supply, an output terminal for supplying the current to the load, a first switch, a resistive element, and a sensor circuit. The first switch is electrically connected between the input terminal and the output terminal. The resistive element includes a first terminal electrically connected to the input terminal and a second terminal electrically connected to the output terminal. The sensor circuit receives a detection voltage generated at the resistive element as the current flows between the input terminal and the output terminal, for sensing that the current is an over-current, when the current reaches an over-current level and the detection voltage exceeds a threshold voltage. The sensor circuit includes an adjustment circuit. The adjustment circuit adjusts in advance the detection voltage such that the detection voltage exceeds the threshold value if the current is at an over-current level.

According to a still further aspect, the present invention provides an electronic device, including a power supply for supplying a current to a load and an interface circuit for connecting the power supply and the load. The interface circuit includes a circuit board and a high side switch circuit mounted on the circuit board. The high side switch circuit includes an input terminal for receiving the current supplied from the power supply, an output terminal for supplying the current to the load, a first switch, a resistive element, and a sensor circuit. The first switch is electrically connected between the input terminal and the output terminal. The resistive element includes a first terminal electrically connected to the input terminal and a second terminal electrically connected to the output terminal. The sensor circuit receives a detection voltage generated at the resistive element as the current flows between the input terminal and the output terminal, for sensing that the current is an over-current, when the current reaches an over-current level and the detection voltage exceeds a threshold voltage. The sensor circuit includes an adjustment circuit. The adjustment circuit adjusts in advance the detection voltage such that the detection voltage exceeds the threshold value if the current is at an over-current level.

According to a still further aspect, the present invention provides a high side switch circuit, including: an input terminal for receiving a current supplied from a power supply; an output terminal for supplying the current to a load; a transistor electrically connected between the input terminal and the output terminal; an over-current sensor unit sensing flow of over-current through the transistor; and a current limiting circuit. The current limiting circuit lowers, when the over-current is detected by the over-current sensor unit, control voltage of the transistor from a first voltage for setting the transistor to a fully on state to a second voltage for setting the transistor to an incompletely on state, to limit current flowing through the transistor. The current limiting circuit includes first and second voltage dropping circuits connected in parallel with a control electrode of the transistor for lowering the control voltage. The first voltage dropping circuit lowers the control voltage from the first voltage to a third voltage between the first and second voltages at a first time rate of change. The second voltage dropping circuit lowers, after the control voltage reached the third voltage, the control voltage from the third voltage to the second voltage at a second time rate of change. The first time rate of change is higher than the second time rate of change.

Preferably, the high side switch circuit further includes a charge pump. The charge pump boosts a voltage applied to the input terminal and thereby applies the first voltage to the control electrode of the transistor, and is stopped by an output of the over-current sensor unit. The first voltage dropping circuit includes a first switch and a constant voltage circuit. The first switch is connected to at least one of a ground node and the control electrode of the transistor, and turned on in response to an output of the over-current sensor unit. The constant voltage circuit is electrically connected between the ground node and the control electrode of the transistor through the first switch, thereby to apply the third voltage to the control electrode. The second voltage dropping circuit includes a resistive element for causing a current to flow from a node between the charge pump and the control electrode to the ground node, and a second switch. The second switch is turned on by an output of the over-current sensor unit, for forming a current path from the node to the ground node through the resistive element.

Preferably, the constant voltage circuit includes at least one diode. The at least one diode is arranged to cause a forward current to flow in a direction from the control electrode of the transistor to the ground node.

Preferably, the constant voltage circuit includes at least one diode-connected transistor. The at least one diode-connected transistor is arranged to cause a forward current to flow in a direction from the control electrode of the transistor to the ground node.

According to a still further aspect, the present invention provides an interface circuit for supplying a current from a power supply to a load. The interface circuit includes a circuit board and a high side switch circuit mounted on the circuit board. The high side switch circuit includes an input terminal for receiving a current supplied from the power supply, an output terminal for supplying the current to the load, a transistor electrically connected between the input terminal and the output terminal, an over-current sensor unit sensing flow of over-current through the transistor, and a current limiting circuit. The current limiting circuit lowers, when the over-current is detected by the over-current sensor unit, control voltage of the transistor from a first voltage for setting the transistor to a fully on state to a second voltage for setting the transistor to an incompletely on state, to limit current flowing through the transistor. The current limiting circuit includes first and second voltage dropping circuits connected in parallel with a control electrode of the transistor for lowering the control voltage. The first voltage dropping circuit lowers the control voltage from the first voltage to a third voltage between the first and second voltages at a first time rate of change. The second voltage dropping circuit lowers, after the control voltage reached the third voltage, the control voltage from the third voltage to the second voltage at a second time rate of change. The first time rate of change is higher than the second time rate of change.

According to a still further aspect, the present invention provides an electronic device, including a power supply for supplying a current to a load and an interface circuit for connecting the power supply and the load. The interface circuit includes a circuit board and a high side switch circuit mounted on the circuit board. The high side switch circuit includes an input terminal for receiving a current supplied from the power supply, an output terminal for supplying the current to the load, a transistor electrically connected between the input terminal and the output terminal, an over-current sensor unit sensing flow of over-current through the transistor, and a current limiting circuit. The current limiting circuit lowers, when the over-current is detected by the over-current sensor unit, control voltage of the transistor from a first voltage for setting the transistor to a fully on state to a second voltage for setting the transistor to an incompletely on state, to limit current flowing through the transistor. The current limiting circuit includes first and second voltage dropping circuits connected in parallel with a control electrode of the transistor for lowering the control voltage. The first voltage dropping circuit lowers the control voltage from the first voltage to a third voltage between the first and second voltages at a first time rate of change. The second voltage dropping circuit lowers, after the control voltage reached the third voltage, the control voltage from the third voltage to the second voltage at a second time rate of change. The first time rate of change is higher than the second time rate of change.

According to one aspect of the present invention, it is possible to improve accuracy of detecting over-current in the high side switch while preventing increase of the cost for the high side switch. According to another aspect of the present invention, it is possible to protect not only the high side switch but also circuitry connected to the high side switch, if an over current through the high side switch is detected.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
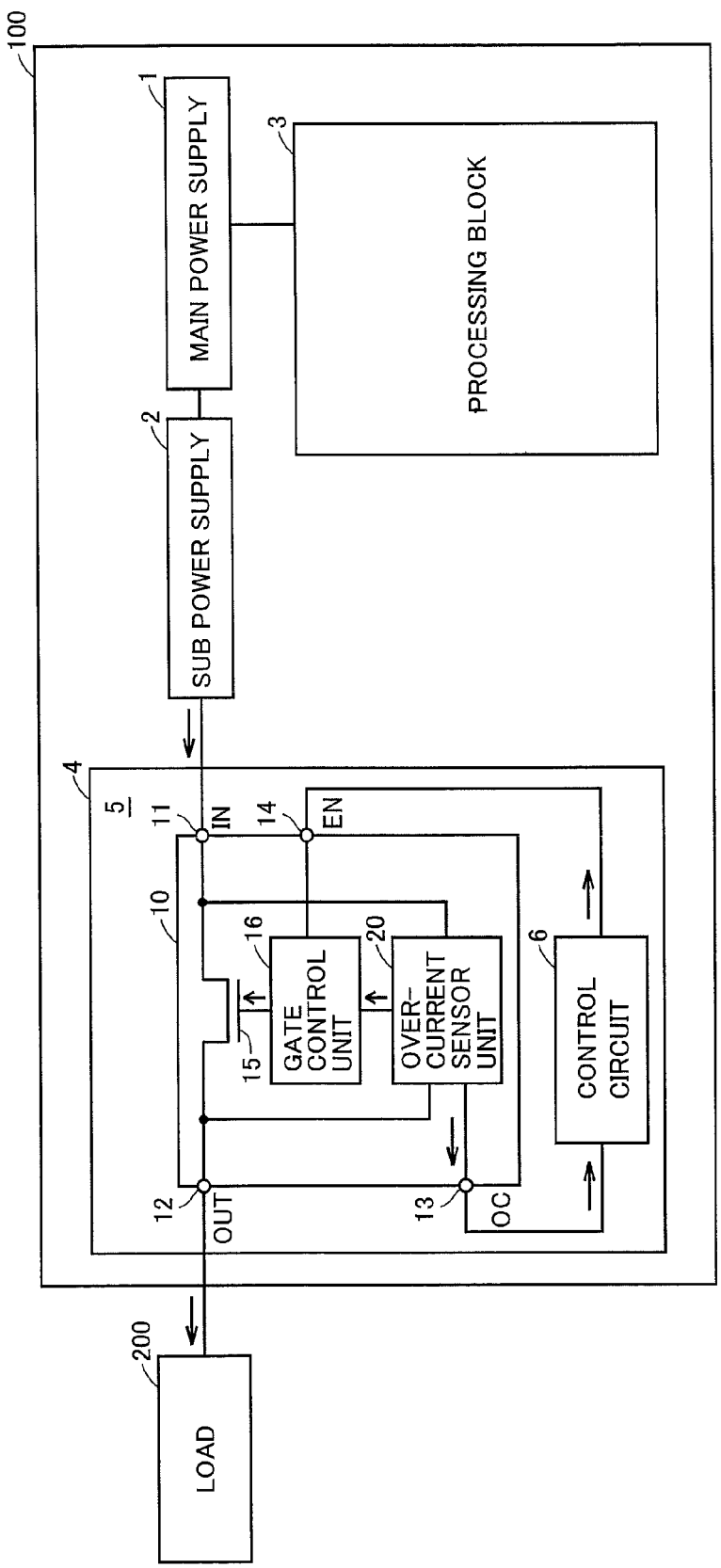
FIG. 1 is a schematic block diagram of an electronic device including the high side switch circuit in accordance with a first embodiment of the present invention.

In the following, the present invention will be described in detail with reference to the figures. The same or corresponding portions will be denoted by the same reference characters, and description thereof will not be repeated.

Embodiment 1

FIG. 1 is a schematic block diagram of an electronic device including the high side switch circuit in accordance with the first embodiment of the present invention.

Referring to FIG. 1, an electronic device 100 includes a main power supply 1, a sub power supply 2, a processing block 3, and an interface circuit 4. Main power supply 1 supplies power supply voltage to sub power supply 2 and processing block 3. Sub power supply 2 receives the power supply voltage from main power supply 1 and from the voltage, generates a power supply voltage (of, for example, DC 5V) to be supplied to interface circuit 4. Processing block 3 is the main body of electronic device 100. Processing block 3 executes a prescribed process by the power supply voltage supplied from main power supply 1.

Interface circuit 4 is connected to a load 200, and supplies the power supply voltage output from sub power supply 2 to load 200. Interface circuit 4 includes a circuit board 5, a control circuit 6 and a high side switch circuit 10. Control circuit 6 and high side switch circuit 10 are mounted on circuit board 5.

High side switch circuit 10 is connected between sub power supply 2 and load 200. Control circuit 6 controls high side switch circuit 10 in response to a signal output from high side switch circuit 10. Thus, power supply control of interface circuit 4 is realized.

Interface circuit 4 is, for example, an interface circuit in compliance with USB (Universal Serial Bus) standard. The standard for interface circuit 4, however, is not specifically limited. Similarly, electronic device 100 may be a PC (Personal Computer), a printer, a TV set, an audio device or the like, and it is not specifically limited, either.

In the present embodiment, high side switch circuit 10 is implemented by a semiconductor integrated circuit (IC). High side switch circuit 10 includes an input terminal (IN) 11, an output terminal (OUT) 12, an over-current monitor terminal (OC) 13, an enable (EN) terminal 14, an MOS transistor 15, a gate control unit 16, and an over-current sensor unit 20.

Input terminal 11 is for receiving a current output from sub power supply 2. Output terminal 12 is for supplying a current to load 200.

MOS transistor 15 is a high side switch connected between input terminal 11 and output terminal 12. MOS transistor 15 is, specifically, an N-channel MOSFET. MOS transistor 15 has its drain connected to input terminal 11. MOS transistor 15 has its source connected to output terminal 12.

Gate control unit 16 controls gate voltage of MOS transistor 15 and thereby turns MOS transistor 15 on/off. At the on state of MOS transistor 15, the current output from sub power supply 2 is supplied through MOS transistor 15 to load 200.

If the current flowing through MOS transistor 15 becomes excessively high, over-current sensor unit 20 detects the over-current of MOS transistor 15. Over-current sensor unit 20 outputs a signal representing the result of detection by over-current sensor unit 20 to gate control unit 16. In accordance with the result of detection by over-current sensor unit 20, gate control unit 16 limits the current flowing to MOS transistor 15 or turns off MOS transistor 15.

Over-current sensor unit 20 further outputs the signal representing the result of detection by over-current sensor unit 20 to the outside through over-current monitor terminal 13. Control circuit 6 receives the signal output from over-current monitor terminal 13. Here, control circuit 6 outputs a disable signal for stopping high side switch circuit 10. The disable signal is input to gate control unit 16 through enable terminal 14. In response to the disable signal, gate control unit 16 turns off MOS transistor 15. On the other hand, if control circuit 6 does not receive the signal from over-current sensor unit 20, control circuit 6 outputs an enable signal. The enable signal is a signal for setting high side switch circuit 10 to an operable state. The enable signal is input to gate control unit 16 through enable terminal 14. In response to the enable signal, gate control unit 16 turns on MOS transistor 15.

High side switch circuit 10 may include other functional blocks for realizing various protection functions, in addition to over-current sensor unit 20.

Figure 2:
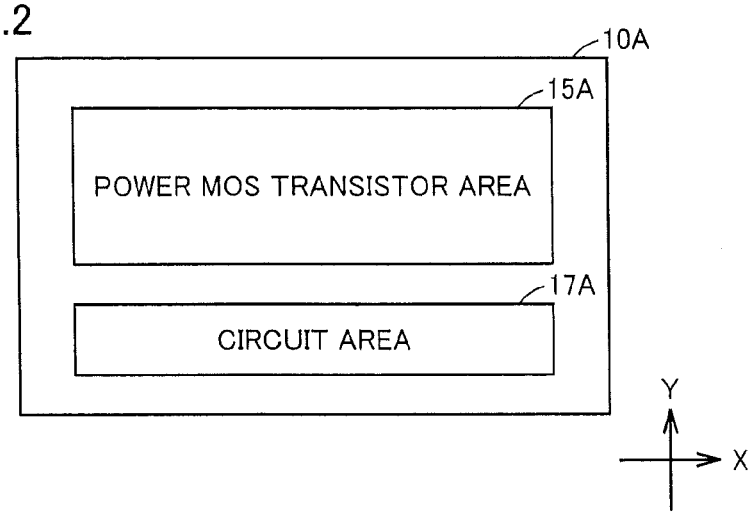
FIG. 2 is a schematic diagram showing a planar layout of a semiconductor chip on which a high side switch circuit 10 shown in FIG. 1 is formed.

FIG. 2 is a schematic diagram showing a planar layout of a semiconductor chip on which high side switch circuit 10 shown in FIG. 1 is formed. Referring to FIG. 2, a semiconductor chip 10A includes a power MOS transistor area 15A and a circuit area 17A. Power MOS transistor area 15A includes a large number of parallel-connected transistor elements (not shown). The large number of transistor elements collectively form MOS transistor 15 shown in FIG. 1. Circuit area 17A is an area on which gate control unit 16 and over-current sensor unit 20 are formed.

Length, in the widthwise direction (X-direction) of semiconductor chip 10A and length in the lengthwise direction (Y-direction) of semiconductor chip 10A depend on the shape of a package on which semiconductor chip 10A is mounted. In the present embodiment, semiconductor chip 10A has a rectangular shape, and length in the X-direction of semiconductor chip 10A is longer than the length in the Y-direction.

Figure 3:
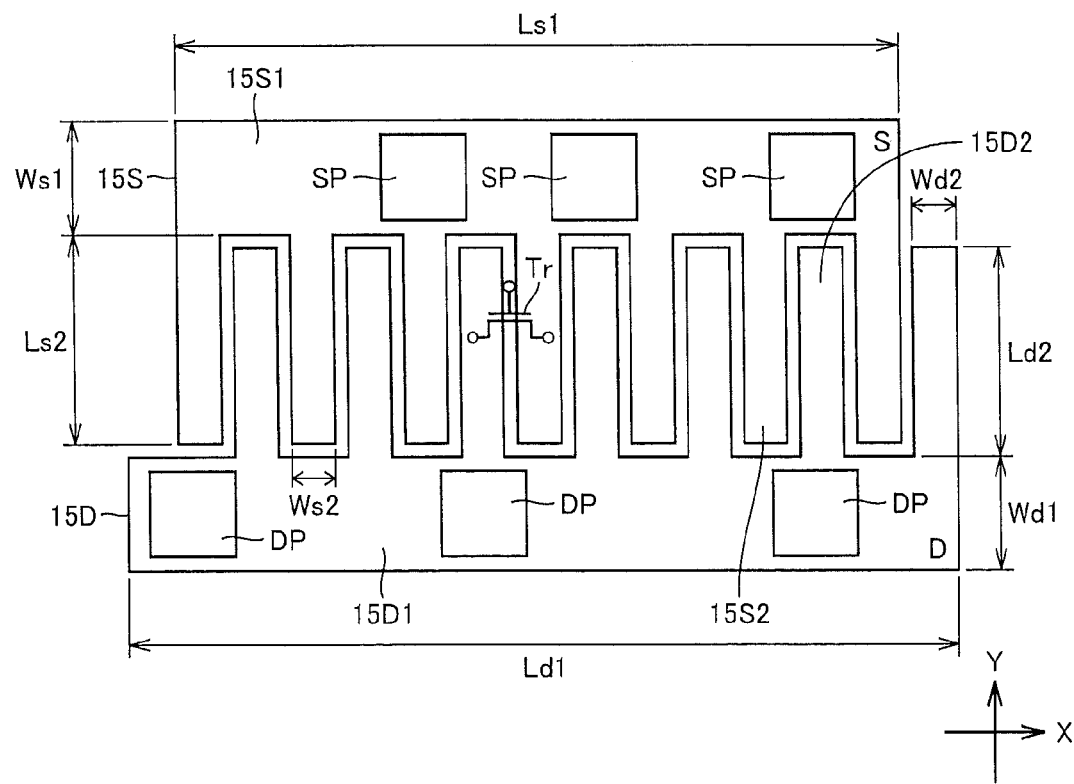
FIG. 3 is a plan view schematically showing source and drain electrodes arranged on a power MOS transistor area 15A shown in FIG. 2.

FIG. 3 is a plan view schematically showing source and drain electrodes arranged on power MOS transistor area 15A shown in FIG. 2. Referring to FIG. 3, the X- and Y-directions correspond to the X- and Y-directions shown in FIG. 2, respectively. Similarly, the X- and Y-directions of drawings referred to in the following also correspond to the X- and Y-directions shown in FIG. 2, respectively. Therefore, description related to the X- and Y-directions will not be repeated.

As shown in FIG. 3, a drain (D) electrode 15D has a first drain electrode portion 15D1 extending in the X-direction, and a plurality of second drain electrode portions 15D2 each drawn in the Y-direction from the first drain electrode portion 15D1. On first drain electrode portion 15D1, a plurality of drain pad areas DP each forming a drain pad, are formed.

The first drain electrode portion 15D1 has length Ld1 and width Wd1. The second drain electrode portion 15D2 has length Ld2 and width Wd2, where Ld1>Ld2 and Wd1>Wd2.

Similarly, a source (S) electrode 15S has a first source electrode portion 15S1 extending in the X-direction, and a plurality of second source electrode portions 15S2 each drawn in the Y-direction from the first source electrode portion 15S1. On the first source electrode portion 15S1, a plurality of source pad areas SP each forming a source pad are formed. To the drain pads and source pads, wires, not shown, are connected.

The first source electrode portion 15S1 has length Ls1 and width Ws1. The second source electrode portion 15S2 has length Ls2 and width Ws2, where Ls1>Ls2 and Ws1>Ws2.

As shown in FIG. 3, the second drain electrode portions 15D2 and the second source electrode portions 15S2 are arranged alternately along the X-direction.

If the semiconductor device having high side switch circuit 10 formed therein has a multilayer interconnection structure, an interconnection layer on which drain electrode 15D and source electrode 15S are formed and an interconnection layer for connecting drain electrode 15D and source electrode 15S to drain diffusion region and source diffusion region, respectively, may be provided. Alternatively, the drain electrode and the source electrode may be directly connected to the drain diffusion region and the source diffusion region (both not shown) formed in the semiconductor substrate, respectively.

Resistance value when MOS transistor 15 is turned on is estimated to be a sum of on-resistance value of MOS transistor 15, resistance value of drain electrode 15D and resistance value of source electrode 15S. The smaller the resistance values of drain electrode 15D and source electrode 15S, the smaller becomes the resistance value of high side switch when the high side switch is turned on. Thus, loss in the high side switch can be reduced.

The resistance value of drain electrode 15D depends on the resistance value of first drain electrode portion 15D1 and the resistance value of second drain electrode portions 15D2. In the present embodiment, a plurality of pads are arranged in dispersed manner on the first drain electrode portion 15D1. The second drain electrode portions 15D2 connect in parallel the drain electrodes of a plurality of MOS transistor elements formed in the power MOS transistor area. The second drain electrode portions 15D2 extend along the shorter side direction (Y-direction) of the power MOS transistor area. Therefore, the resistance value of drain electrode 15D can be reduced. It is noted that one transistor element Tr is shown as a representative example in FIG. 3.

Source electrode 15S has a structure similar to drain electrode 15D. Specifically, a plurality of pads are arranged in a dispersed manner on the first source electrode portion 15S1. The second source electrode portions 15S2 connect in parallel the source electrodes of a plurality of MOS transistor elements formed in the power MOS transistor area. Thus, the resistance value of source electrode 15S can be reduced.

In the following, the reason why the resistance values of drain electrode 15D and source electrode 15S can be reduced by the configuration of these electrodes will be described, by comparing the present embodiment with comparative examples.

Figure 4:
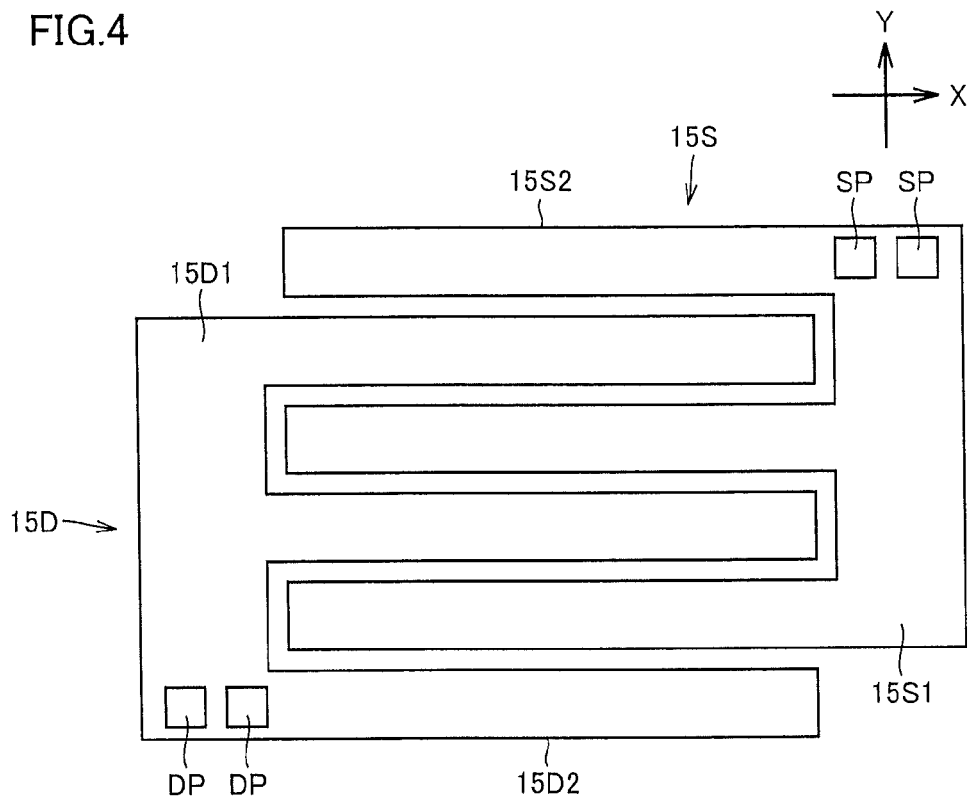
FIG. 4 is a plan view showing a first comparative example of the source and drain electrodes related the first embodiment.
Figure 5:
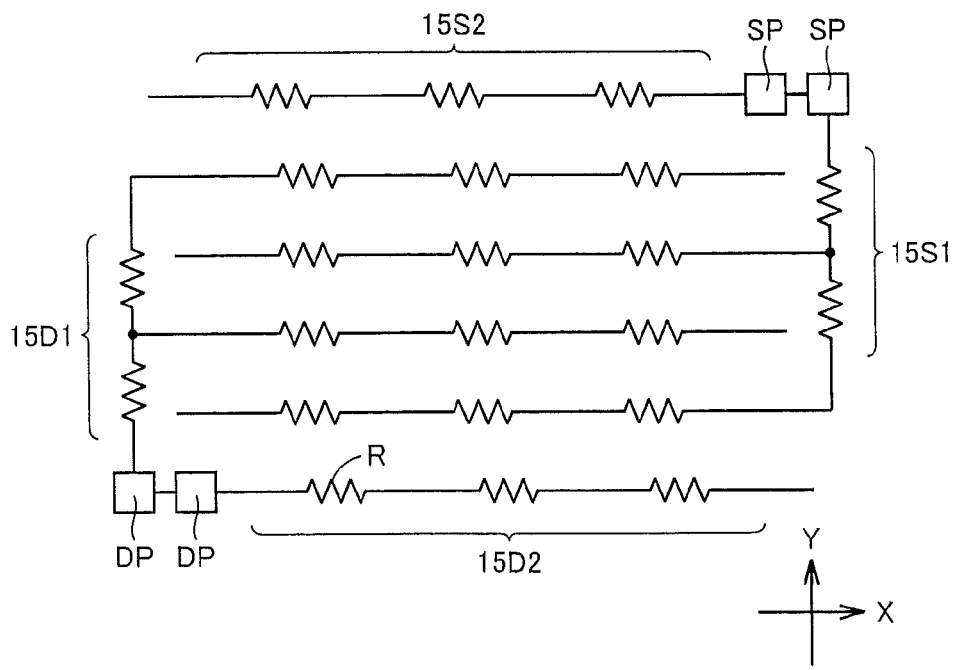
FIG. 5 is an equivalent circuit diagram of the source and drain electrodes shown in FIG. 4.

FIG. 4 is a plan view showing a first comparative example of the source and drain electrodes related to the first embodiment. FIG. 5 is an equivalent circuit diagram of the source and drain electrodes shown in FIG. 4. Referring to FIGS. 4 and 5, a plurality of drain pad areas DP are arranged concentrated on the first drain electrode portion 15D1. The first drain electrode portion 15D1 and the second drain electrode portion 15D2 are represented as resistor R connected to drain pad areas DP. Since the second drain electrode portion 15D2 extends in the X-direction, it comes to be longer. As a result, the second drain electrode portion 15D2 comes to have higher resistance value. Therefore, the resistance value of drain electrode 15D as a whole comes to be higher.

Figure 6:
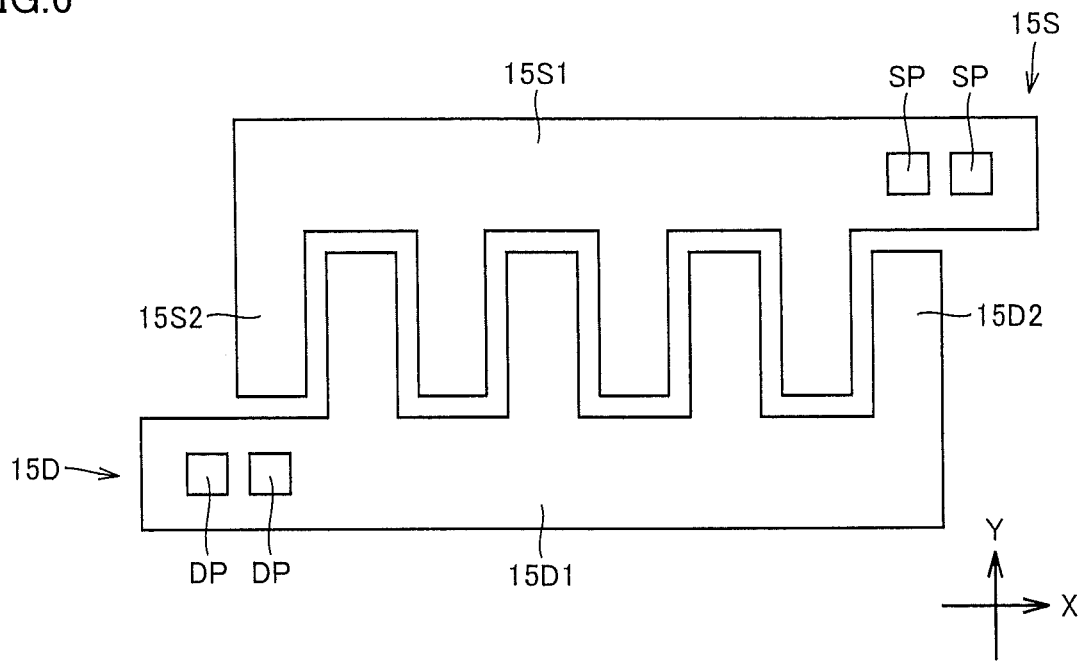
FIG. 6 is a plan view showing a second comparative example of the source and drain electrodes related to the first embodiment.
Figure 7:
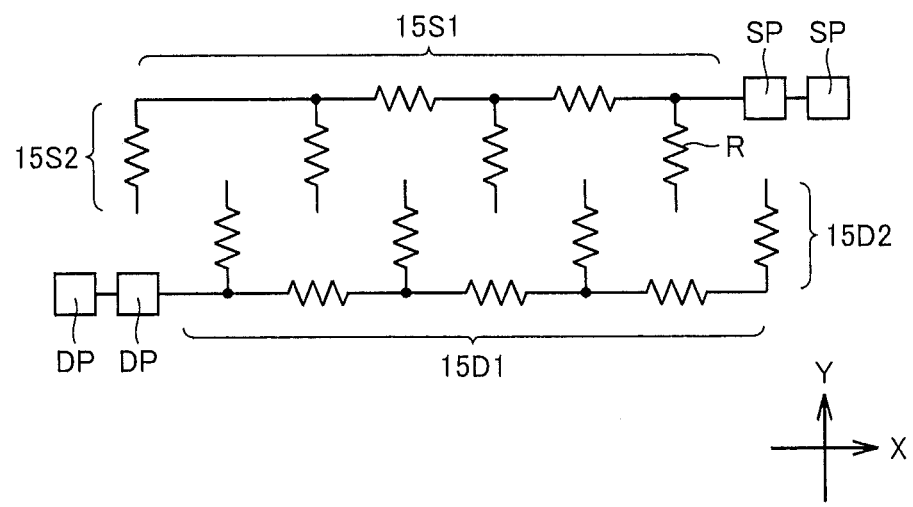
FIG. 7 is an equivalent circuit diagram of the source and drain electrodes shown in FIG. 6.

FIG. 6 is a plan view showing a second comparative example of the source and drain electrodes related to the present embodiment. FIG. 7 is an equivalent circuit diagram of the source and drain electrodes shown in FIG. 6. Referring to FIGS. 6 and 7, a plurality of drain pad areas DP are arranged concentrated on the first drain electrode portion 15D1. Since the second drain electrode portions 15D2 extend in the Y-direction, the resistance value of the second electrode portion 15D2 becomes lower than in the first comparative example. However, that portion of first drain electrode portion 15D1 which extends from drain pad area DP in the X-direction is long. Therefore, the resistance value of the first drain electrode portion 15D1 becomes higher. Accordingly, drain electrode 15D has high resistance value. From the same reason, the overall resistance value of source electrode 15S is also high.

Figure 8:
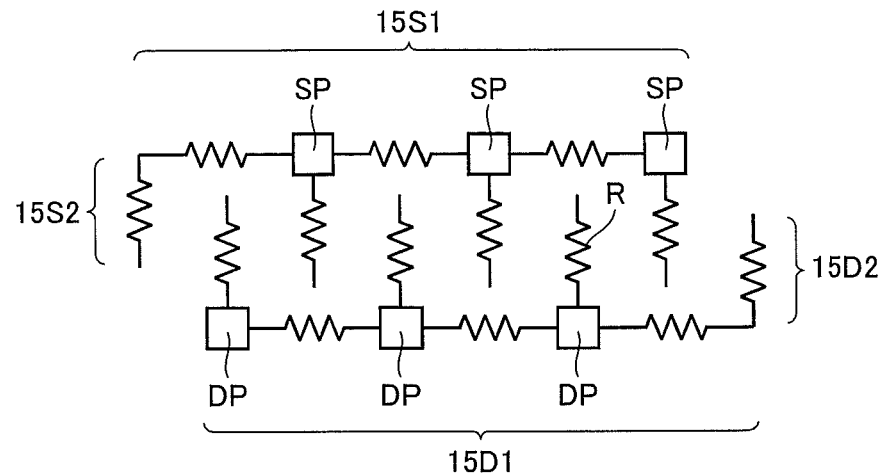
FIG. 8 is an equivalent circuit diagram of the source and drain electrodes in accordance with the first embodiment.

FIG. 8 is an equivalent circuit diagram of the source and drain electrodes in accordance with the first embodiment. Referring to FIGS. 3 and 8, in the first drain electrode portion 15D1, the plurality of drain pad areas DP are arranged in a dispersed manner. Therefore, even though the first drain electrode portion 15D1 is long as it extends in the X-direction, the resistance value of the first drain electrode portion 15D1 can be decreased. Since the second drain electrode portions 15D2 extend in the Y-direction, the second drain electrode portions 15D2 are short. Therefore, the resistance value of second drain electrode portions 15D2 can be made low.

As described above, according to the first embodiment, by reducing resistance values of the first drain electrode portion 15D1 and the second drain electrode portions 15D2, the resistance value of drain electrode 15D can be reduced. From the same reason, the resistance value of source electrode 15S can also be reduced. Therefore, power loss when MOS transistor 15 is on can be reduced.

Figure 9:
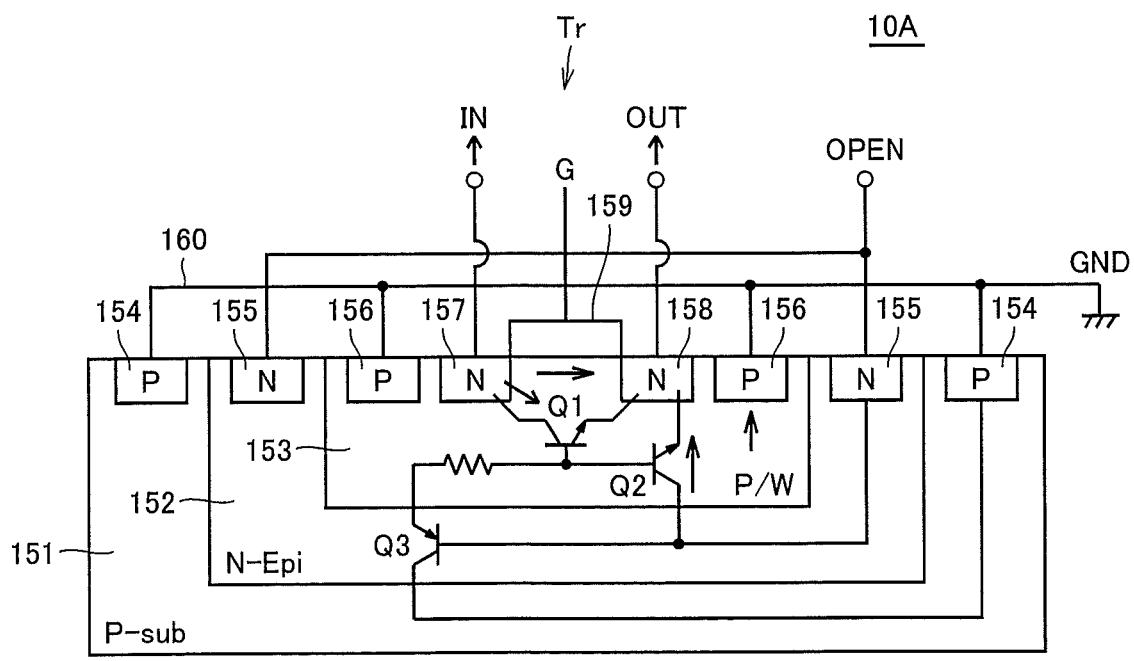
FIG. 9 is a schematic cross-sectional view of a semiconductor chip, illustrating the structure of a transistor element forming MOS transistor 15 shown in FIG. 1.

FIG. 9 is a schematic cross-sectional view of a semiconductor chip, illustrating the structure of a transistor element forming MOS transistor 15 shown in FIG. 1. Referring to FIG. 9, semiconductor chip 10A has a P-type semiconductor substrate 151, an N-type epitaxial layer 152 formed on P-type semiconductor substrate 151, and a P-type well 153 formed in N-type epitaxial layer 152. In P-type semiconductor substrate 151, p-type diffusion regions 154 are formed. In N-type epitaxial layer 152, N-type diffusion regions 155 are formed. In order to form an island of N-type epitaxial layer 152, generally, a highly-doped P-type diffusion region (isolation region) reaching P-type semiconductor substrate 151 from the surface of semiconductor chip is formed. In FIG. 9, the isolation region is also shown as a part of P-type semiconductor substrate 151.

On P-type well 153, a gate electrode 159 is formed with a gate oxide film (not shown) posed therebetween. On P-type well 153, N-type diffusion regions 157 and 158 and P-type diffusion region 156 are further formed. N-type diffusion regions 157 and 158 and gate electrode 159 form a transistor element Tr. N-type diffusion region 157 is connected to an input terminal (IN) and, hence, it becomes a drain region. N-type diffusion region 158 is connected to an output terminal (OUT) and, hence, it becomes a source region. P-type well 153 functions as a body (back gate) of transistor element Tr.

P-type diffusion regions 154 and 156 are connected to a ground line 160 and thus grounded. Thus, P-type semiconductor substrate 151 and P-type well 153 are grounded. On the other hand, N-type diffusion region 155 is set to open potential and, therefore, the potential of N-type epitaxial layer 152 comes to be the open potential.

In the structure shown in FIG. 9, generally, the potential of N-type epitaxial layer 152 is set to be the highest, and the potential of P-type semiconductor substrate 151 is set to be the lowest. Consequently, N-type epitaxial layer 152 is electrically isolated from P-type semiconductor substrate 151. Further, the potential of P-type well 153 is set to a potential lower than that of N-type epitaxial layer 152, for example, to a potential common to P-type semiconductor substrate 151.

N-type diffusion region 157, P-type well 153 and N-type diffusion region 158 form a parasitic NPN transistor Q1. Further, N-type epitaxial layer 152, P-type well 153 and N-type diffusion region 158 form a parasitic NPN transistor Q2. Further, P-type well 153, N-type epitaxial layer 152 and N-type diffusion region 158 form a parasitic PNP transistor Q3.

When transistor element Tr is on, a current flows from the drain region (N-type diffusion region 157) to the source region (N-type diffusion region 158) through the channel region at the surface of P-type well 153. If N-type epitaxial layer 152 is set to have a high potential, it is possible that parasitic NPN transistor Q2 is turned on by the current flowing through P-type well 153.

According to the present embodiment, the potential of N-type epitaxial layer 152 is set to the open potential. Further, P-type well 153 is grounded. Therefore, the potential of P-type well 153 becomes equal to the potential of P-type semiconductor substrate 151. This prevents operation of parasitic NPN transistor Q2. Further, in the present embodiment, P-type diffusion regions 156 are arranged to divide MOS transistor 15 into small pieces. As a result, the current flowing through P-type well 153 is dispersed and, hence, possibility of the potential floating of P-type well 153 can be reduced. Therefore, operation of parasitic NPN transistor Q2 can more reliably be prevented.

Figure 10:
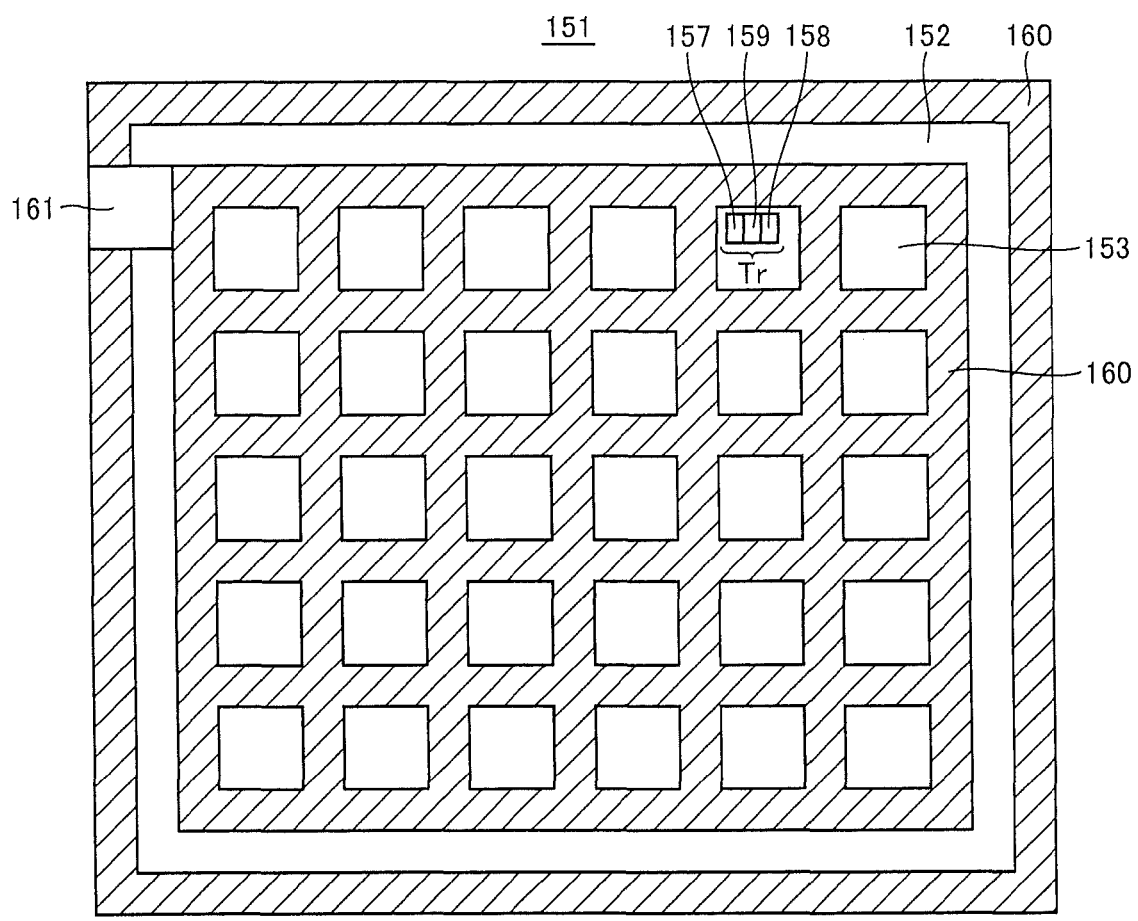
FIG. 10 is a schematic diagram showing a planar layout of a ground line shown in FIG. 9.

FIG. 10 is a schematic diagram showing a planar layout of a ground line shown in FIG. 9. Referring to FIG. 10, ground line 160 is connected to a pad 161. Ground line 160 is arranged as a lattice on P-type well 153. Consequently, MOS transistor 15 shown in FIG. 1 (see FIG. 1) is divided into a plurality of groups each including a plurality of transistor elements Tr. Each group including a plurality of transistor elements Tr is surrounded by ground line 160. FIG. 10 shows one transistor element Tr as a representative example.

Figure 11:
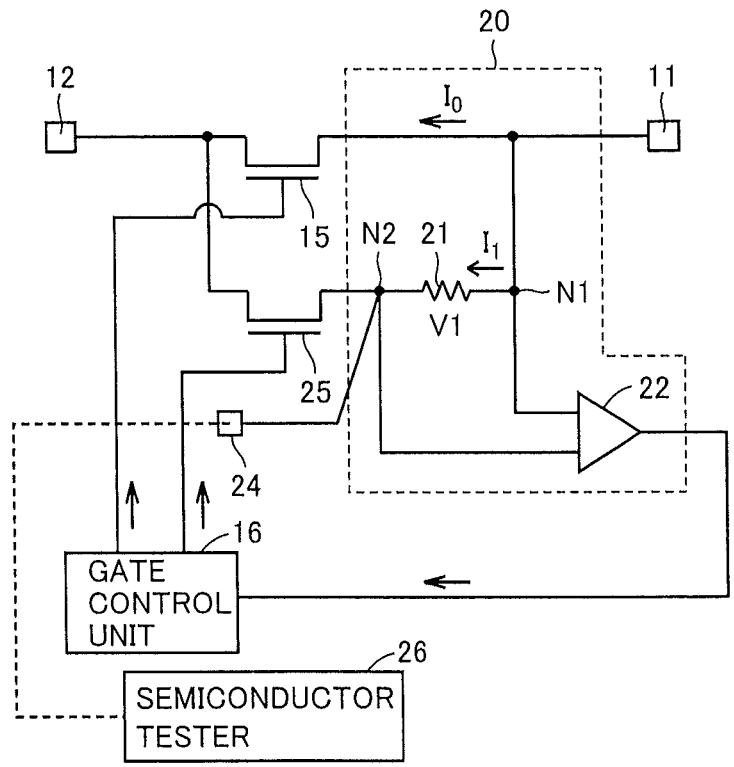
FIG. 11 shows a configuration of an over-current sensor circuit in accordance with the first embodiment.

FIG. 11 shows a configuration of an over-current sensor circuit in accordance with the first embodiment. Referring to FIG. 11, over-current sensor unit 20 includes a sensing resistor 21 and a comparator 22. Sensing resistor 21 and an MOS transistor 25 are connected in series. Sensing resistor 21 and MOS transistor 25 are connected between input terminal 11 and output terminal 12, in parallel with MOS transistor 15.

When the high side switch circuit is in operation, gate control unit 16 turns MOS transistors 15 and 25 both on. At this time, a current $I_0$ flows through MOS transistor 15 and a current $I_1$ flows through MOS transistor 25. Thus, a voltage V1 generates between a first terminal N1 of sensing resistor 21 and a second terminal N2 of sensing resistor 21. Voltage V1 is determined by a product of resistance value of sensing resistor 21 and current $I_1$.

Comparator 22 detects whether or not voltage V1 is higher than a threshold voltage. If the voltage V1 is higher than the threshold voltage, comparator 22 outputs a detection signal indicating detection of over-current. Receiving the detection signal, gate control unit 16 controls MOS transistors 15 and 25 for over-current protection. For example, gate control unit 16 limits the currents flowing through MOS transistors 15 and 25 or outputs a signal for turning off MOS transistors 15 and 25, to the gates of MOS transistors 15 and 25.

To the second terminal of sensing resistor 21, a test pad 24 is connected. To test pad 24, a semiconductor tester 26 is connected. Semiconductor tester 26 tests function of over-current sensor unit 20. Specifically, semiconductor tester 26 generates a current (for example, current $I_1$) flowing from the first end to the second end of sensing resistor 21. The value of this current is determined in advance such that the voltage determined by a product of the current value and the resistance value (design value) of sensing resistor 21 becomes higher than the above-described threshold voltage (reference voltage). If the resistance value of sensing resistor 21 is normal (within standard range), over-current sensor unit 20 detects an over-current when semiconductor tester 26 generates the above-described current.

Sensing resistor 21, however, is a resistor formed inside the semiconductor integrated circuit. Generally, because of manufacturing variations, it is difficult to improve accuracy of resistance value of resistive elements formed on a semiconductor chip. Variation in resistance values may possibly lead to variation of current value $I_1$ when the voltage V1 generated by sensing resistor 21 exceeds the reference voltage, among products. In other words, the current value when the over-current is detected may vary product by product. Various methods may be possible to reduce variation of over-current detection value.

Figure 12:
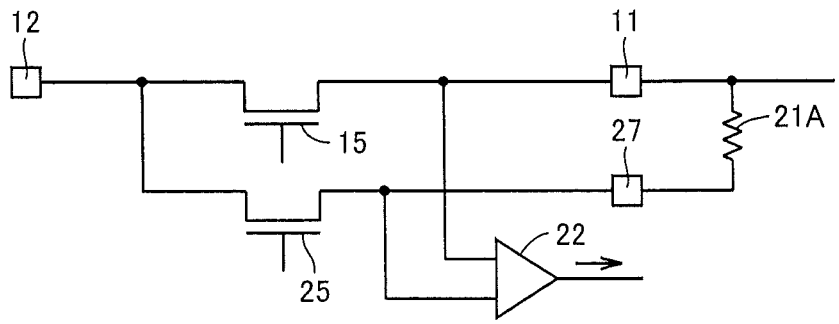
FIG. 12 shows an exemplary configuration for reducing variation in over-current detection value using an external resistor.

FIG. 12 shows an exemplary configuration for reducing variation in over-current detection value using an external resistor. Referring to FIG. 12, an external sensing resistor 21A is connected between input terminal 11 and an over-current sensing terminal 27. In this configuration, no sensing resistor is formed in the semiconductor integrated circuit. Since an external resistor having highly accurate resistance value is used, higher accuracy of over-current sensing is expected. It is necessary, however, to mount not only the semiconductor integrated circuit but also the sensing resistor on the interface circuit. This leads to increased cost for the components and increased cost for mounting the components.

Figure 13:
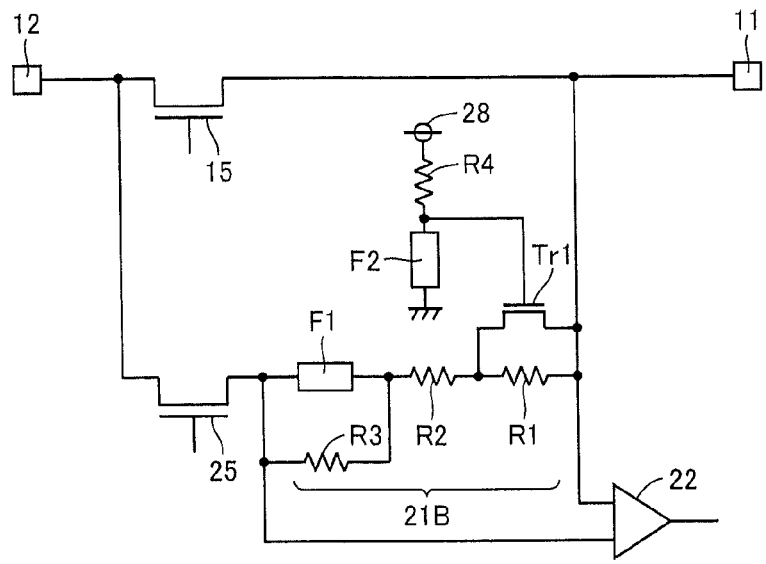
FIG. 13 shows an exemplary configuration for adjusting resistance value of a sensing resistor using a fuse resistor.

On the other hand, as a method of improving accuracy of resistance value of a resistance circuit included in the semiconductor integrated circuit, adjustment of resistance value by a fuse resistor has been known. FIG. 13 shows an exemplary configuration for adjusting resistance value of a sensing resistor using a fuse resistor.

Referring to FIG. 13, a sensing resistor 21B includes resistive elements R1, R2 and R3 connected in series with each other. Fuse resistor F1 is connected in parallel with resistive element R3. Resistive element R1 is connected in parallel with an N-channel MOS transistor Tr1 functioning as a switch. A resistive element R4 and a fuse resistor F2 are connected in series between a high voltage node 28 and a ground node. MOS transistor Tr1 has its gate connected to a node between resistive element R4 and fuse resistor F2. When fuse resistor F1 is blown, resistive element R3 is selected. On the other hand, when fuse resistor F2 is blown, MOS transistor Tr1 turns on. Thus, resistive element R1 is not selected.

In most cases, an element which is cut when a large current flows is used as the fuse resistor. In the configuration shown in FIG. 13, fuse resistor F1 is arranged on a path of the current flowing to MOS transistor 25. When high side switch circuit operates, MOS transistors 15 and 25 both turn on and, therefore, it is expected that a relatively large current flows through MOS transistor 25. Therefore, it may be difficult to arrange a fuse resistor on a path through which a relatively large current flows in a normal situation.

In the first embodiment, the voltage V1 can be adjusted such that when the value of current flowing between input terminal 11 and output terminal 12 reaches a prescribed over-current level, the voltage generated at sensing resistor 21 exceeds the threshold voltage corresponding to the over-current level. More specifically, comparator 22 is configured to allow adjustment of its input offset voltage. Thus, deviation of the current value (in other words, the voltage V1) detected by sensing resistor 21 can be corrected. As a result, over-current can be detected with high accuracy.

Figure 14:
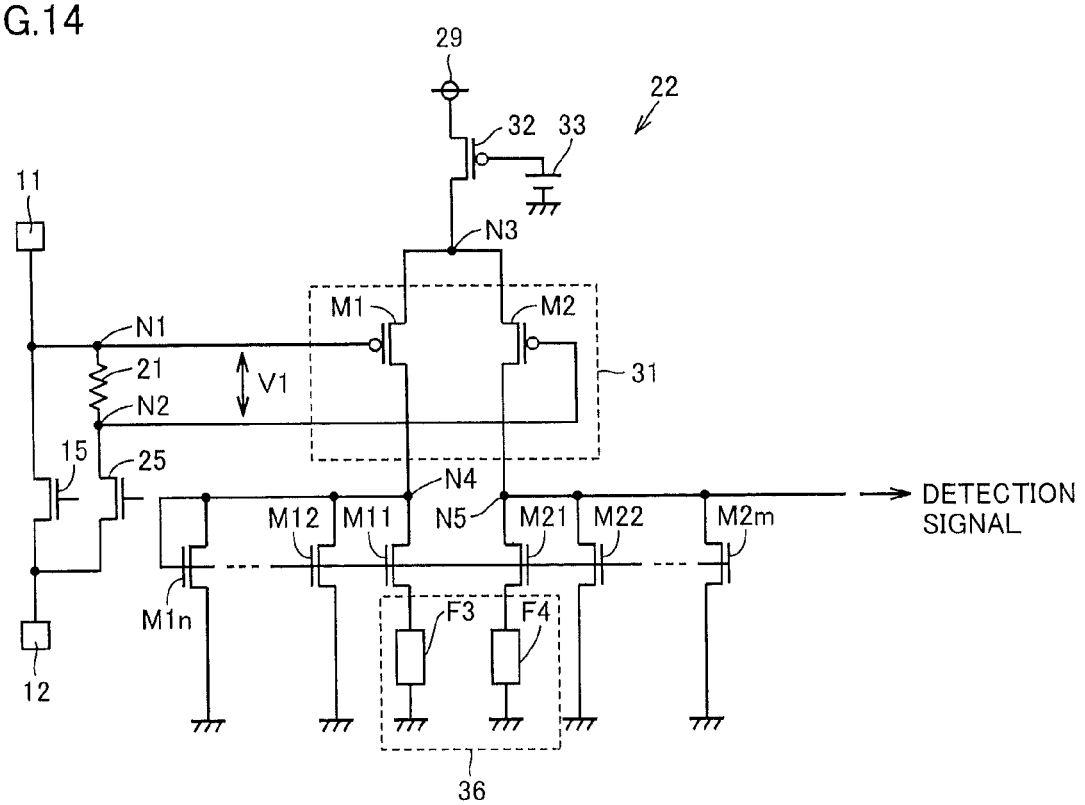
FIG. 14 shows an exemplary configuration of a comparator in accordance with the first embodiment.

FIG. 14 shows an exemplary configuration of a comparator in accordance with the first embodiment. Referring to FIG. 14, comparator 22 includes a differential unit 31 including transistors M1 and M2, and a transistor 32. Transistor 32 is connected between a power supply node 29 and a node N3, and driven by a voltage from a bias power supply 33. Transistor M1 is arranged between nodes N3 and N4, and operates receiving a voltage of first terminal N1 of sensing resistor 21. Transistor M2 is arranged between nodes N3 and N5, and operates receiving a voltage at second terminal N2 of sensing resistor 21.

Comparator 22 further includes n transistors M11, M12, . . . , M1n connected in parallel with node N4, and m transistors M21, M22, . . . , M2m connected in parallel with node N5. Transistors M11, M12, . . . M1n and M21, M22, . . . M2m form a current mirror circuit. By appropriately determining mirror ratio, the voltage V1 is corrected. Here, the mirror ratio is a ratio of the total current flowing through transistors M11, M12, . . . M1n to the total current flowing through transistors M21, M22, . . . M2m. Therefore, the voltage V1 can be adjusted such that a detection signal is output from node N4 when the voltage V1 exceeds the threshold voltage. In other words, the input offset voltage of comparator 22 is corrected.

Transistor M11 is connected to a ground node through a fuse resistor F3. Similarly, transistor M21 is connected to the ground node through a fuse resistor F4. By blowing fuse resistor F3 (F4), transistor M11 (M21) is unselected. In this manner, the current flowing from node N3 (N4) to the ground node can be adjusted and, thus, the voltage V1 can be adjusted. Fuse resistors F3 and F4 form an adjustment circuit 36.

The number of fuse resistors is not limited to the above. Further, the number of transistors connected to node N3 and their size are not limited. The same applies to the transistors connected to node N4.

Fuse resistors F3 and F4 are not arranged on a current path between input terminal 11 and output terminal 12. Therefore, constant flow of large current to fuse resistors F3 and F4 is avoided. Accordingly, the voltage V1 can be adjusted by fuse resistors F3 and F4. Therefore, according to the first embodiment of the present invention, accuracy of over-current detection can be improved. The method of blowing fuse resistor is not specifically limited, and laser trimming, for example, is available.

As described above, according to the first embodiment of the present invention, accuracy of detecting over-current in the high side switch circuit can be improved without using an external resistor. Therefore, the cost for the interface circuit including the high side switch circuit can be reduced.

Further, according to the first embodiment of the present invention, even if the detected voltage (voltage V1) varies because of variation in resistance value of the sensing resistor, the variation in detected voltage can be corrected by the fuse resistors. Specifically, the variation in detected values when the over-current sensor circuit is inspected by semiconductor tester 26 can be corrected. As a result, production yield of semiconductor integrated circuits having the high side switch circuit formed thereon can be improved.

Second Embodiment

Figure 15:
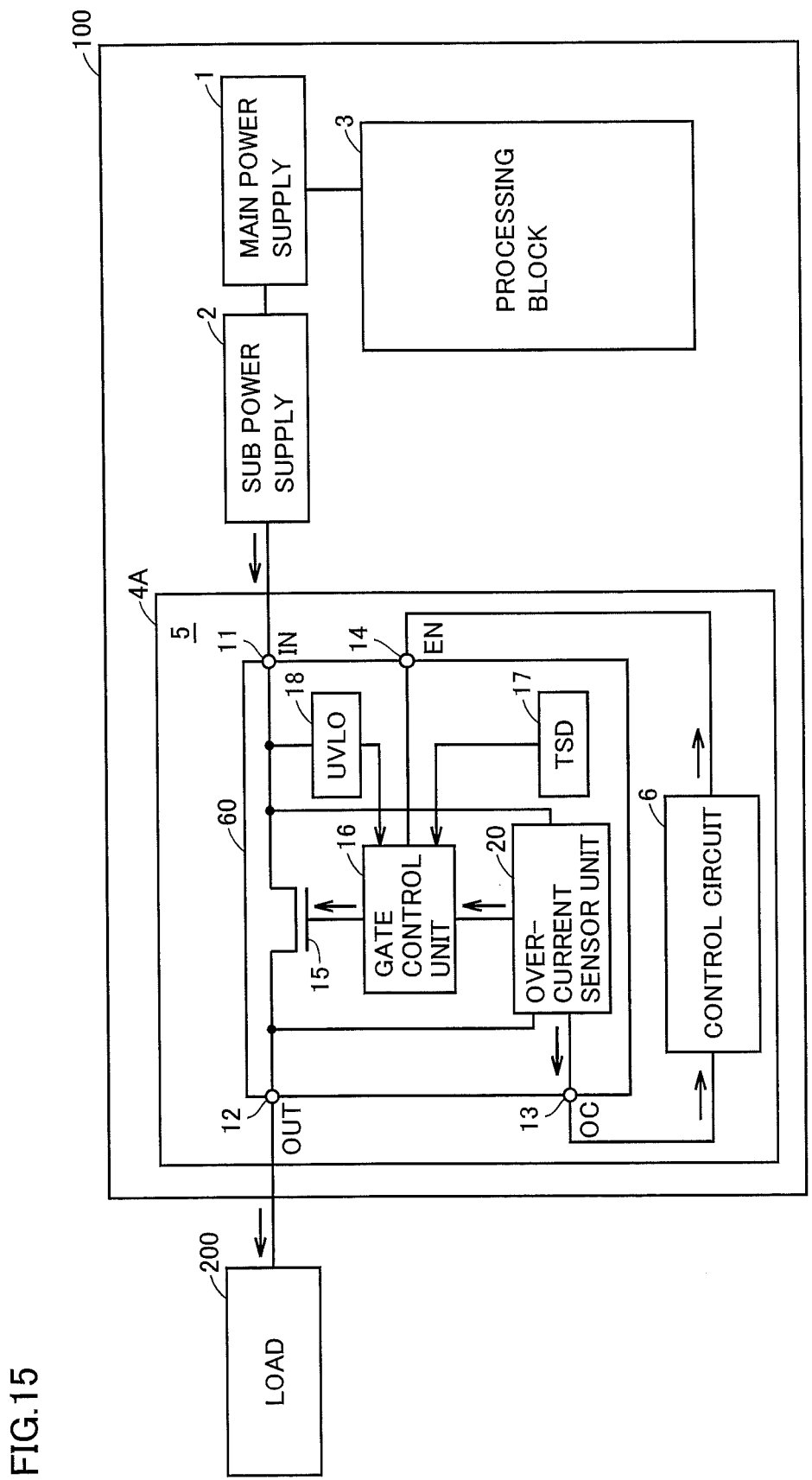
FIG. 15 is a schematic block diagram of an electronic device including a high side switch circuit in accordance with a second embodiment of the present invention.

FIG. 15 is a schematic block diagram of an electronic device including a high side switch circuit in accordance with a second embodiment of the present invention.

Referring to FIGS. 1 and 15, an interface circuit 4A differs from interface circuit 4 in that it includes a high side switch circuit 60 in place of high side switch circuit 10. Configuration of other portions of electronic device 100 shown in FIG.

15 is the same as the configuration of corresponding portions shown in FIG. 1 and, therefore, description thereof will not be repeated.

In the present embodiment, high side switch circuit 60 is implemented by a semiconductor integrated circuit. High side switch circuit 60 further differs from high side switch circuit 10 in that it additionally includes a thermal shutdown circuit (TSD) 17 and an under voltage lockout circuit (UVLO) 18.

Thermal shutdown circuit 17 outputs a signal for turning off MOS transistor 15 to gate control unit 16 if the temperature of high side switch circuit 60 exceeds a prescribed threshold value. In response to the signal from thermal shutdown circuit 17, gate control unit 16 turns off MOS transistor 15. Under voltage lockout circuit 18 monitors the voltage at input terminal 11. If the voltage at input terminal 11 is lower than a prescribed threshold voltage, under voltage lockout circuit 18 outputs a signal for turning off MOS transistor 15 to gate control unit 16. In response to the signal from under voltage lockout circuit 18, gate control unit 16 turns off MOS transistor 15.

Configuration of other portions of high side switch circuit 60 is the same as the configuration of corresponding portions of high side switch circuit 10 and, therefore, description thereof will not be repeated. Planar layout of the semiconductor chip on which high side switch circuit 60 is formed is the same as the layout shown in FIGS. 2, 3 and 8 and, therefore, description thereof will not be repeated. Therefore, similar to the first embodiment, power loss at the time of turn off of MOS transistor 15 can be reduced in the second embodiment.

The cross-sectional structure of transistor element forming MOS transistor 15 is the same as the structure shown in FIG. 9 and, therefore, description thereof will not be repeated. As in the first embodiment, in the second embodiment, the potential of N-type epitaxial layer 152 is set to open potential. Further, as P-type well 153 is grounded, the potential of P-type well 153 becomes equal to the potential of P-type semiconductor substrate 151. Consequently, operation of parasitic NPN transistor Q2 can be prevented.

Further, according to the second embodiment, P-type diffusion regions 156 are arranged to divide MOS transistor 15 into small pieces. As a result, the current flowing through P-type well 153 is dispersed and, hence, possibility of the potential floating of P-type well 153 can be reduced. Therefore, operation of parasitic NPN transistor Q2 can more reliably be prevented.

The planar layout of ground line in accordance with the second embodiment is the same as the layout shown in FIG. 10 and, therefore, description thereof will not be repeated.

Figure 16:
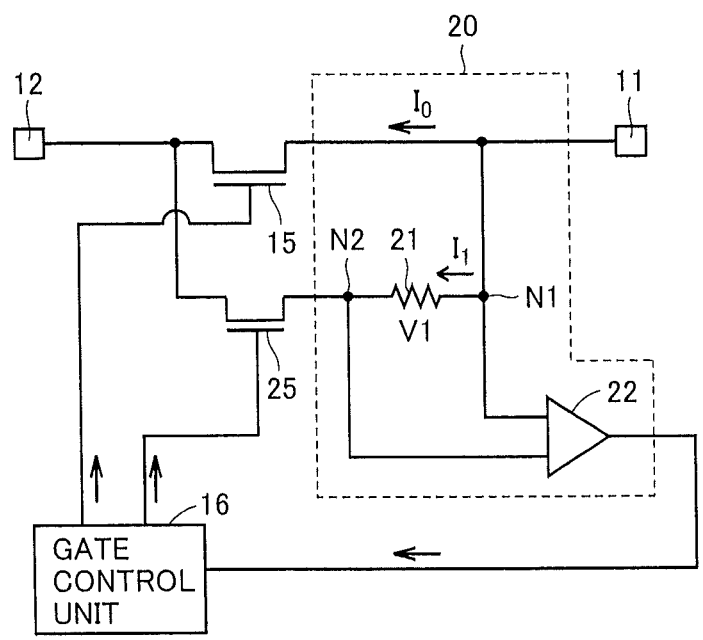
FIG. 16 shows a configuration of the over-current sensor circuit in accordance with the second embodiment.

FIG. 16 shows a configuration of the over-current sensor circuit in accordance with the second embodiment. Referring to FIG. 16, over-current sensor unit 20 includes sensing resistor 21 and comparator 22. Sensing resistor 21 and MOS transistor 25 are connected in series. Sensing resistor 21 and MOS transistor 25 are connected between input terminal 11 and output terminal 12 in parallel with MOS transistor 15.

When high side switch circuit is in operation, gate control unit 16 applies a gate voltage for setting MOS transistor 15 to a fully on state (FULL ON) to the gate of MOS transistor 15. Further, gate control unit 16 applies a gate voltage for turning on MOS transistor 25 to the gate of MOS transistor 25. Here, a current $I_0$ flows through MOS transistor 15 and a current $I_1$ flows through sensing resistor 21. Thus, a voltage V1 generates between first terminal N1 of sensing resistor 21 and second terminal N2 of sensing resistor 21. Voltage V1 is determined by a product of resistance value of sensing resistor 21 and current $I_1$.

Comparator 22 determines whether or not the voltage V1 is higher than a threshold voltage. If the voltage V1 is higher than the threshold voltage, comparator 22 outputs a detection signal indicating detection of over-current. Receiving the detection signal, gate control unit 16 controls MOS transistor 15 for over-current protection. Specifically, gate control unit 16 lowers the gate voltage of MOS transistor 15 to set MOS transistor to an incompletely on state. On-resistance of MOS transistor 15 in the incompletely on state is higher than the on-resistance of MOS transistor in the fully on state. Therefore, current flowing through MOS transistor 15 can be limited.

Figure 17:
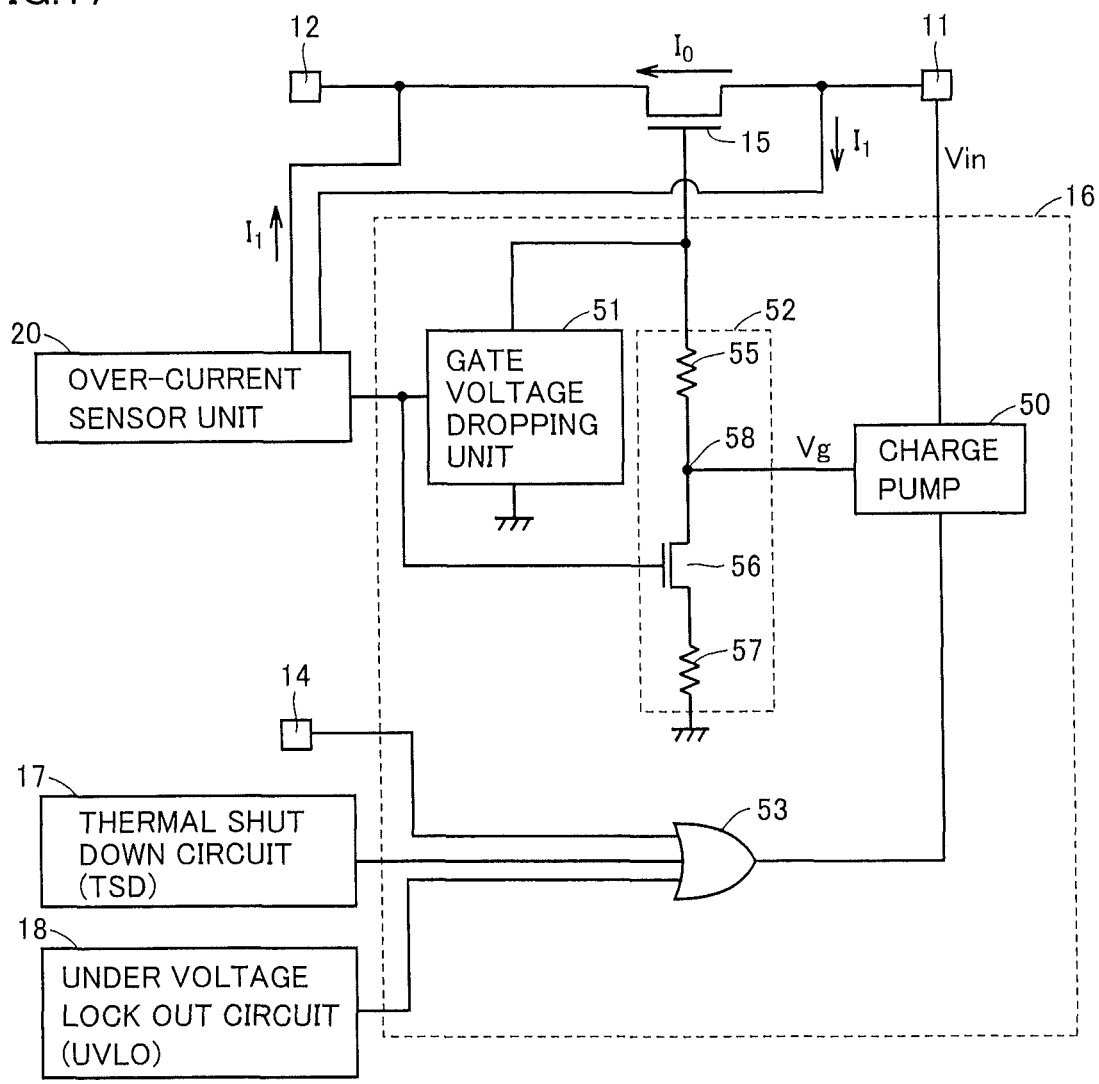
FIG. 17 shows a configuration of a gate control unit 16 shown in FIGS. 15 and 16.

FIG. 17 shows a configuration of a gate control unit 16 shown in FIGS. 15 and 16. Referring to FIG. 17, gate control unit 16 includes a charge pump 50, gate voltage dropping units 51 and 52 and an OR circuit 53. Gate voltage dropping units 51 and 52 form a current limiting circuit limiting the current flowing through MOS transistor 15 when over-current of MOS transistor 15 is detected by over-current sensor unit 20.

Gate voltage dropping units 51 and 52 are connected in parallel with the gate electrode of MOS transistor 15 and lower gate voltage Vg. Gate voltage dropping unit 52 includes resistive elements 55 and 57 and a transistor 56. Specifically, transistor 56 is an N-channel MOS transistor, functioning as a switch. Resistive element 55 is connected between the gate of MOS transistor 15 and charge pump 50. To a node 58, charge pump 50 and resistive element 55 are connected. Further, to node 58, the drain of transistor 56 (one end of the switch) is connected. Node 58 corresponds to a node where charge pump 50 and the gate electrode of MOS transistor 15 are connected. Resistive element 57 is connected between the source of transistor 56 (the other end of the switch) and the ground node. Resistive element 57 is a resistive element for causing a current to flow from the node (node 58) between charge pump 50 and the gate electrode of MOS transistor 15 to the ground node.

Over-current sensor unit 20 senses flow of over-current through MOS transistor 15 using current $I_1$. In that case, over-current sensor unit 20 outputs a current limiting signal for limiting the current flowing through MOS transistor 15. Current $I_1$ is part of the current flowing from input terminal 11 to output terminal 12.

Charge pump 50 boosts a voltage Vin applied to input terminal 11 and thereby applies gate voltage Vg to the gate of MOS transistor 15. Consequently, MOS transistor 15 is set to the fully on state. In a normal state, current $I_0$ does not reach the threshold current level Ith and, therefore, the current limiting signal is not output from over-current sensor unit 20. Specifically, the current limiting signal is at a low level. At this time, gate voltage dropping unit 51 is not operating. Similarly, since transistor 56 of gate voltage dropping unit 52 is off, gate voltage dropping unit 52 is not operating, either.

On the other hand, if current $I_0$ reaches the threshold current level Ith, over-current sensor unit 20 senses that over-current is flowing through MOS transistor 15, based on current $I_1$. At this time, the current limiting signal is output from over-current sensor unit 20. Specifically, the current limiting signal attains to a high level. Here, gate control unit 16 lowers the gate voltage of MOS transistor 15 from a first voltage to a second voltage. The first voltage is the gate voltage for setting MOS transistor 15 to the fully on state, which is equal to the voltage output from charge pump 50 when gate voltage dropping unit 52 is not operating. The second voltage is the gate voltage for setting MOS transistor 15 to the incompletely on state, which is equal to the gate voltage for limiting the current flowing through MOS transistor 15.

Specifically, first, in response to the current limiting signal (high level signal) from over-current sensor unit 20, gate voltage dropping unit 51 lowers the gate voltage of MOS transistor 15 from the afore-mentioned first voltage to a third voltage, at a first time rate of change. The third voltage is between the first and second voltages. Thus, on-resistance of MOS transistor 15 comes to be higher than the on-resistance when MOS transistor 15 is fully on. It is noted that MOS transistor 15 is not fully off but in an incompletely on state.

After the gate voltage reaches the third voltage, gate voltage dropping unit 52 lowers the gate voltage from the third voltage to the second voltage, at a second time rate of change. Here, the first time rate of change is higher than the second time rate of change. In other words, the second time rate of change is smaller than the first time rate of change. Specifically, in response to the current limiting signal (high level signal) from over-current sensor unit 20, transistor 56 (switch) turns on. The gate voltage Vg at this time is determined by the balance between the current supplied from charge pump 50 and the current flowing through transistor 56 and resistive element 57.

OR circuit 53 receives a signal input to enable terminal 14, a signal from thermal shutdown circuit 17, and a signal from under voltage lockout circuit 18. If at least one of these signals is at the high level, a high level signal is output from OR circuit 53. In response to the signal output from OR circuit 53, charge pump 50 stops.

Figure 18:
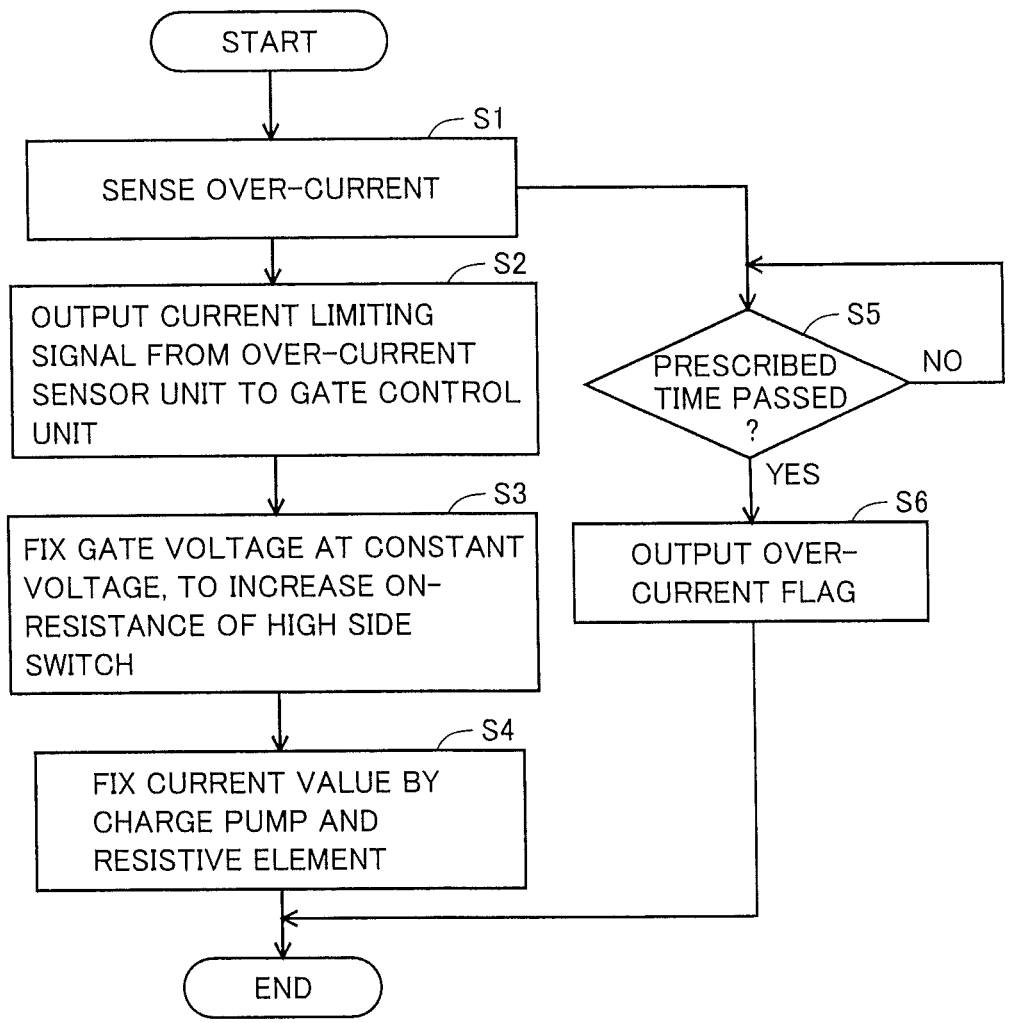
FIG. 18 is a flowchart representing the flow of current limiting operation by the high side switch circuit when an over-current is detected.

FIG. 18 is a flowchart representing the flow of current limiting operation by the high side switch circuit when an over-current is detected. Referring to FIG. 18, over-current sensor unit 20 senses that the current $I_O$ flowing through MOS transistor 15 is an over-current (step S1). Specifically, if the current $I_1$ flowing through over-current sensor unit 20 reaches a prescribed threshold value, over-current sensor unit 20 detects that the current $I_O$ is excessive or over-current (that current $I_O$ has reached the threshold current level Ith).

Next, the current limiting signal is output from over-current sensor unit 20 to gate control unit 16 (step S2). Thereafter, in response to the current limiting signal, gate voltage dropping unit 51 fixes the gate voltage at a constant voltage (third voltage mentioned above) and thereby increases on-resistance of MOS transistor 15 (high side switch) (step S3). Thus, current $I_O$ begins to decrease. After gate voltage dropping unit 51 has lowered the gate voltage of MOS transistor 15, gate voltage dropping unit 52 further lowers the gate voltage of MOS transistor 15. The final gate voltage (second voltage) is determined by charge pump 50 and resistive element 57. As the gate voltage Vg is maintained at the second voltage, the value of current $I_O$ is fixed (step S4).

On the other hand, once over-current is detected, over-current sensor unit 20 determines whether or not a prescribed time period passed from the time of detection of the over-current (step S5). The process of step S5 is repeated until the prescribed time passes (NO at step S5). If the prescribed time period passes (YES at step S5), over-current sensor unit 20 outputs an over-current flag (S6). The flag is output as a signal indicating the result of detection by over-current sensor unit 20 to the outside of high side switch circuit (for example, to control circuit 6 shown in FIG. 15).

Figure 19:
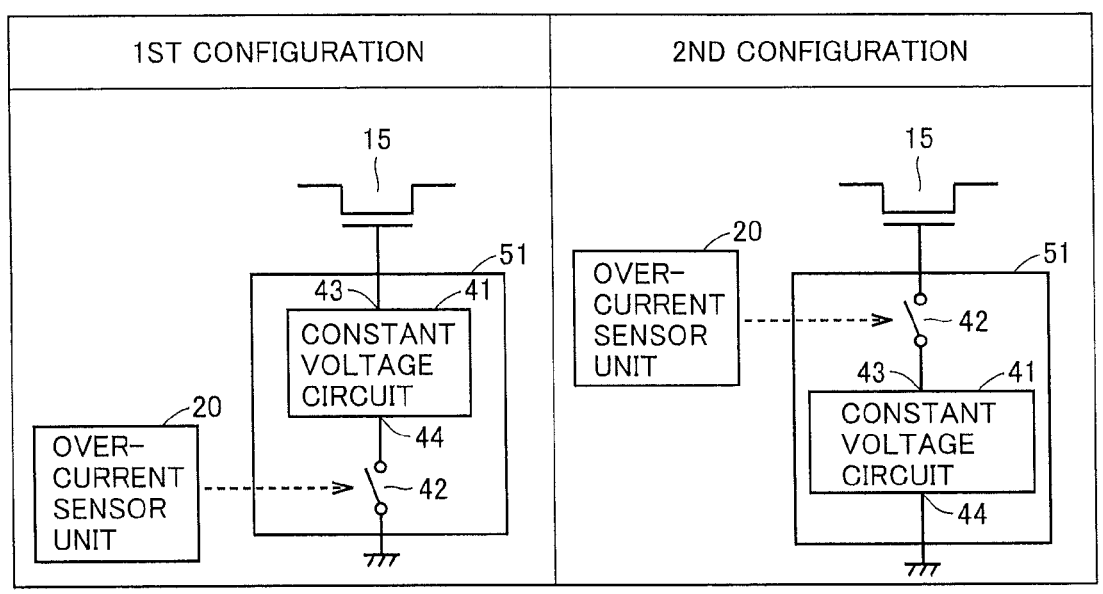
FIG. 19 shows configurations of a gate voltage dropping unit 51 shown in FIG. 17.

FIG. 19 shows configurations of a gate voltage dropping unit 51 shown in FIG. 17. Referring to FIG. 19, gate voltage dropping unit 51 is formed of a constant voltage circuit 41 and a switch 42. Switch 42 is connected to at least one of the ground node and the gate of MOS transistor 15, and turned on in response to an output from over-current sensor unit 20. Constant voltage circuit 41 is electrically connected between the ground node and the gate electrode of MOS transistor 15 through switch 42. When switch 42 turns on, constant voltage circuit 41 applies the prescribed voltage (the third voltage mentioned above) to the gate electrode of MOS transistor 15.

In the first configuration, a high voltage terminal 43 of constant voltage circuit 41 is connected to the gate of MOS transistor 15, and switch 42 is connected between a low voltage terminal 44 of constant voltage circuit 41 and the ground node. In the second configuration, switch 42 is connected between high voltage terminal 43 of constant voltage circuit 41 and the gate of MOS transistor 15, and low voltage terminal 44 of constant voltage circuit 41 is connected to the ground node. It is noted that a first switch may be provided between high voltage terminal 43 of constant voltage circuit 41 and the gate of MOS transistor 15, and a second switch may be provided between low voltage terminal 44 of constant voltage circuit 41 and the ground node.

Figure 20:
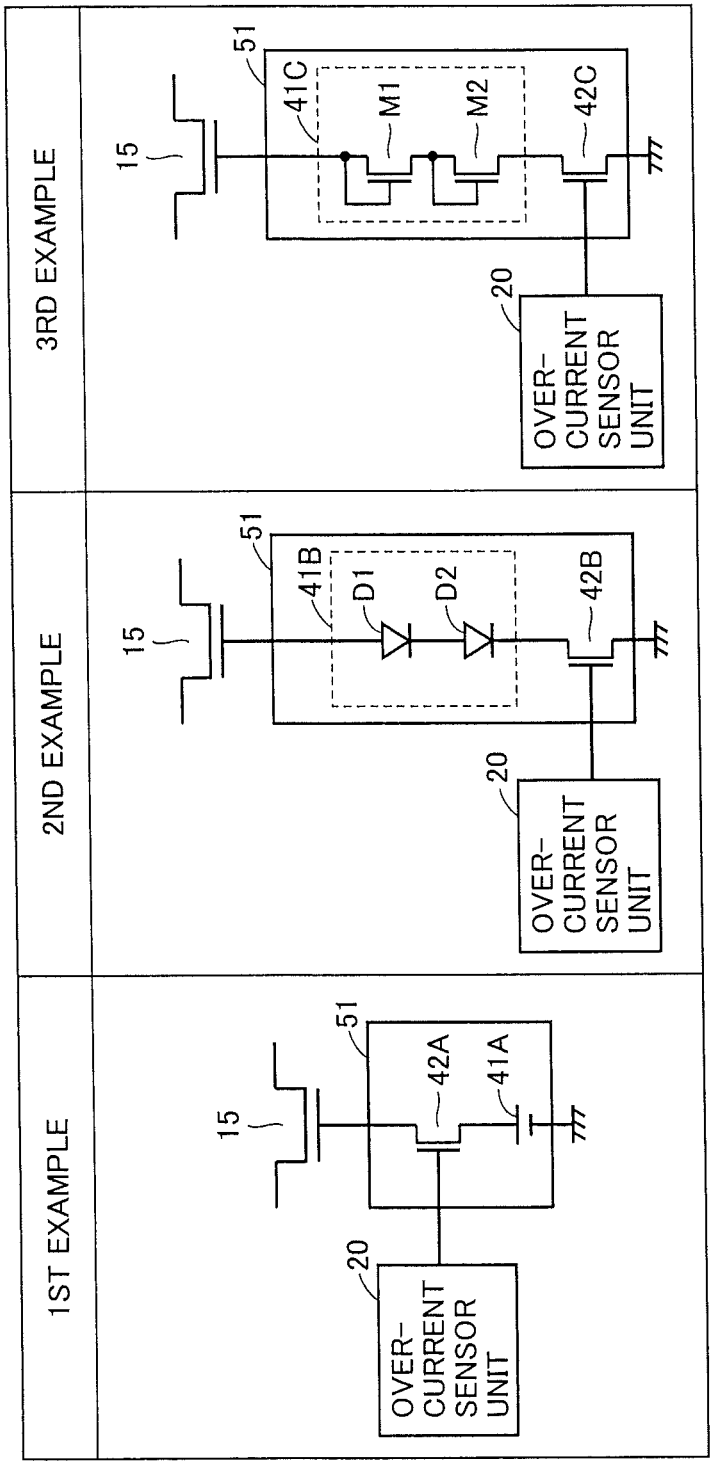
FIG. 20 shows specific examples of the configuration of gate voltage dropping unit 51.

FIG. 20 shows specific examples of the configuration of gate voltage dropping unit 51. Referring to FIG. 20, in the first example, gate voltage dropping unit 51 includes a power supply 41A as a constant voltage circuit, and a transistor 42A as a switch. The configuration of power supply 41A is not specifically limited. Power supply 41A generates the above-described third voltage.

In the second example, gate voltage dropping unit 51 includes a constant voltage circuit 41B formed of series-connected diodes D1 and D2, and a transistor 42B as a switch. Diodes D1 and D2 are connected in series such that a forward current flows in a direction from the gate of MOS transistor 15 to the ground node. Forward voltage Vf of one diode is about 0.7 V. In the second configuration, a voltage of about 1.4 V can be obtained by constant voltage circuit 41B. The number of diodes is not specifically limited, and the number of diodes may be appropriately determined by the setting of the above-described third voltage.

In the third example, gate voltage dropping unit 51 includes a constant voltage circuit 41C formed of diode-connected N-channel MOS transistors M1 and M2, and a transistor 42C as a switch. N-channel MOS transistors M1 and M2 each have the gate and drain connected. Therefore, N-channel MOS transistors M1 and M2 are equivalent to diodes D1 and D2 shown in the second example, respectively. Therefore, in the third configuration, a voltage of about 1.4 V can be obtained by constant voltage circuit 41C. As in the second example, the number of diode-connected MOS transistors is not specifically limited. Further, the diode-connected transistor is not limited to a MOS transistor, and a bipolar transistor may be used.

In place of the constant voltage circuit shown in FIGS. 19 and 20, a D/A converter outputting a prescribed gate voltage in response to a digital signal from a micro computer or the like may be used. It is noted, however, that operation of D/A converter generally requires clocks and, therefore, the time from when over-current is sensed until the prescribed gate voltage is output possibly becomes longer. Further, use of a D/A converter complicates the configuration of gate voltage dropping unit and increases the area of semiconductor chip. In contrast, by the configurations shown in FIG. 20, particularly by the second and third examples, the gate voltage of MOS transistor 15 is lowered utilizing the characteristic of diode element or transistor element itself. Therefore, as compared with the example in which D/A converter is used for lowering the gate voltage of MOS transistor 15, the gate voltage of MOS transistor 15 can be lowered in a shorter time period. Further, the configuration of gate voltage dropping unit 51 can be simplified and the increase of semiconductor chip area can be prevented.

Limitation of current in accordance with the second embodiment of the present invention will be described in further detail.

Figure 21:
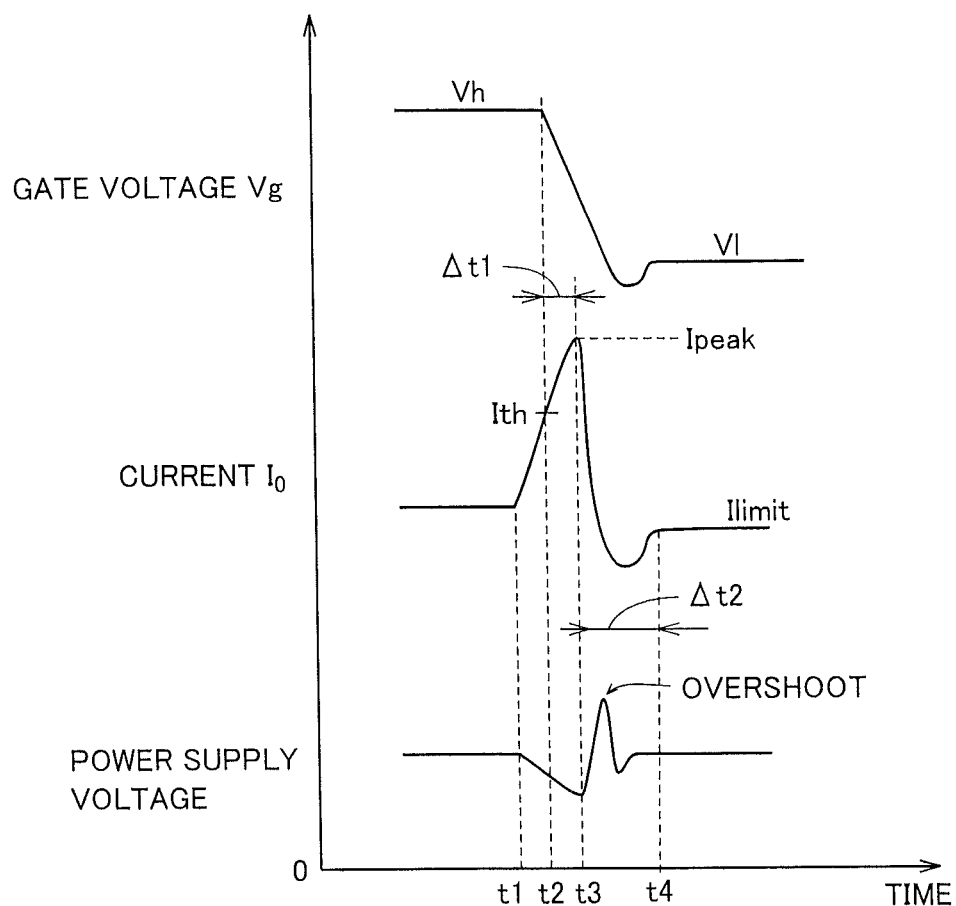
FIG. 21 is a diagram of waveforms showing a first method of limiting a current flowing through the high side switch.

FIG. 21 is a diagram of waveforms showing a first method of limiting a current flowing through the high side switch. Referring to FIG. 21, at time t1, current $I_0$ flowing through the high side switch (MOS transistor 15) abruptly increases. At time t2, current $I_0$ reaches the threshold current level Ith. At this time, over-current sensor unit 20 detects the over-current. In order to limit current $I_0$, gate control unit 16 once lowers the gate voltage Vg of MOS transistor 15 from the voltage Vh (first voltage) to the vicinity of 0 (V). The current $I_0$, however, does not immediately decrease, and continues to increase for a time period Δt1 after exceeding threshold current Ith. At time t3, current $I_0$ starts to decrease, and once lowers to almost 0 (A). Gate voltage Vg lowers from voltage Vh (first voltage) to the vicinity of 0 (V) and thereafter it is set to voltage V1 (second voltage). Current $I_0$ once lowers to the vicinity of 0 (A) and thereafter reaches the limit current Ilimit. After time t4, current $I_0$ is kept at limit current Ilimit. The time period Δt2 represents the time period from the start of decrease of current $I_0$ until current $I_0$ reaches Ilimit.

By making shorter the time period necessary for gate voltage Vg to decrease from Vh to 0(V), decrease of current $I_0$ can be started earlier. It means, however, that the time from the start of decrease of current $I_0$ until current $I_0$ reaches almost 0 (A) also becomes shorter. In other words, the current $I_0$ decreases sharply.

As shown in FIG. 15, MOS transistor 15 and sub power supply 2 are connected through input terminal 11. If current $I_0$ decreases sharply, the power supply voltage of sub power supply 2 instantaneously increases because of inductance component of a line connecting MOS transistor 15 and sub power supply 2. This results in overshoot of power supply voltage of sub power supply 2, as shown in FIG. 21.

Figure 22:
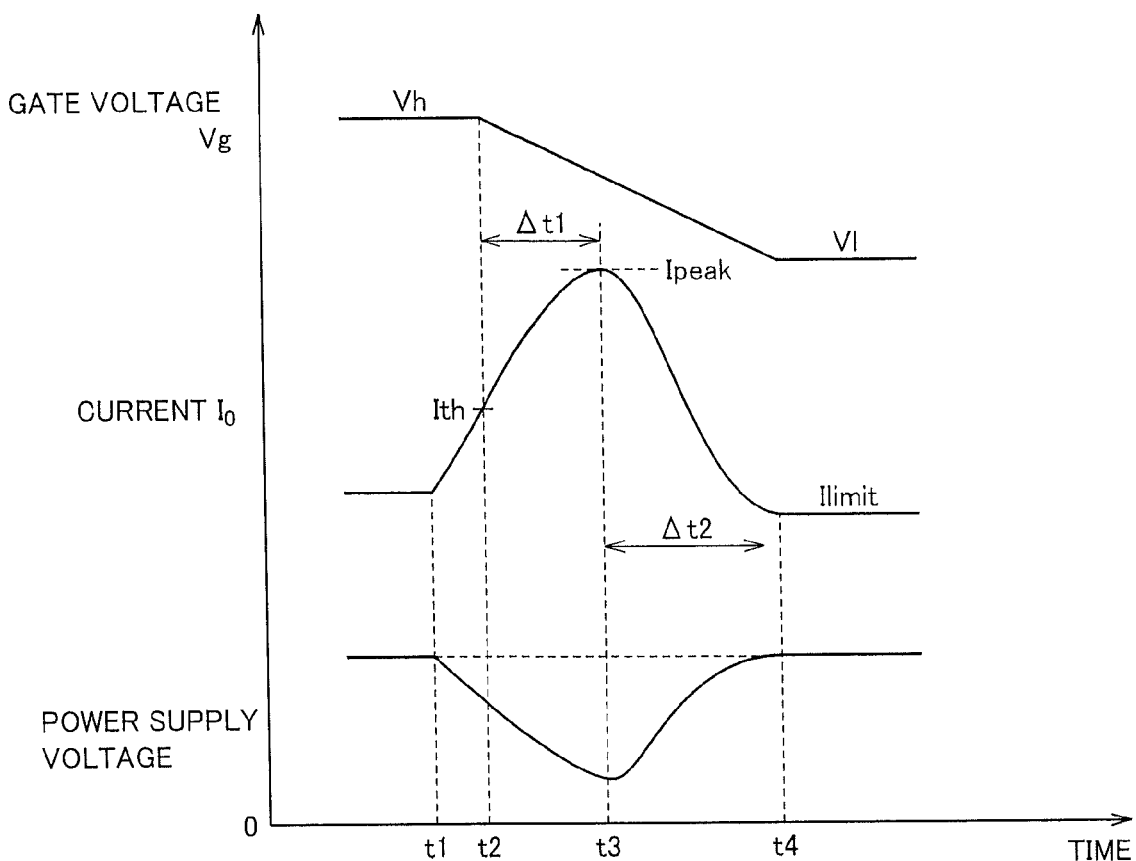
FIG. 22 is a diagram of waveforms showing a second method of limiting a current flowing through the high side switch.

FIG. 22 is a diagram of waveforms showing a second method of limiting a current flowing through the high side switch. Referring to FIG. 22, time t1 to t4 correspond to time t1 to t4 shown in FIG. 21. In the second method, gate voltage Vg of MOS transistor 15 is caused to decrease more moderately after time t2, than in the first method.

According to the second method, the time periods Δt1 and Δt2 are both made longer than in the first method. By making longer the time period Δt2, current $I_0$ comes to decrease more moderately. As a result, the overshoot of power supply voltage possibly caused by the first method can be prevented. According to the second method, however, the time period Δt1 also becomes longer. In the time period Δt1, current $I_0$ increases. Therefore, much current flows before current $I_0$ starts to decrease. Further, peak current Ipeak becomes higher than the peak current generated by the first method. Therefore, it is possible that the power supply voltage of sub power supply 2 lowers significantly. Further, since a large current flows through MOS transistor 15 and the load, MOS transistor 15 and the load may be damaged.

In a method of sharply lowering the current $I_0$ close to 0 (A) upon detection of over-current such as in the first method, the problem of overshoot of power supply voltage may arise. On the other hand, in the second method, the time periods Δt1 and Δt2 are both made longer uniformly. Therefore, even if it becomes possible to prevent overshoot of power supply voltage, a problem of significant decrease of power supply voltage may arise. The second embodiment of the present invention solves both problems.

Figure 23:
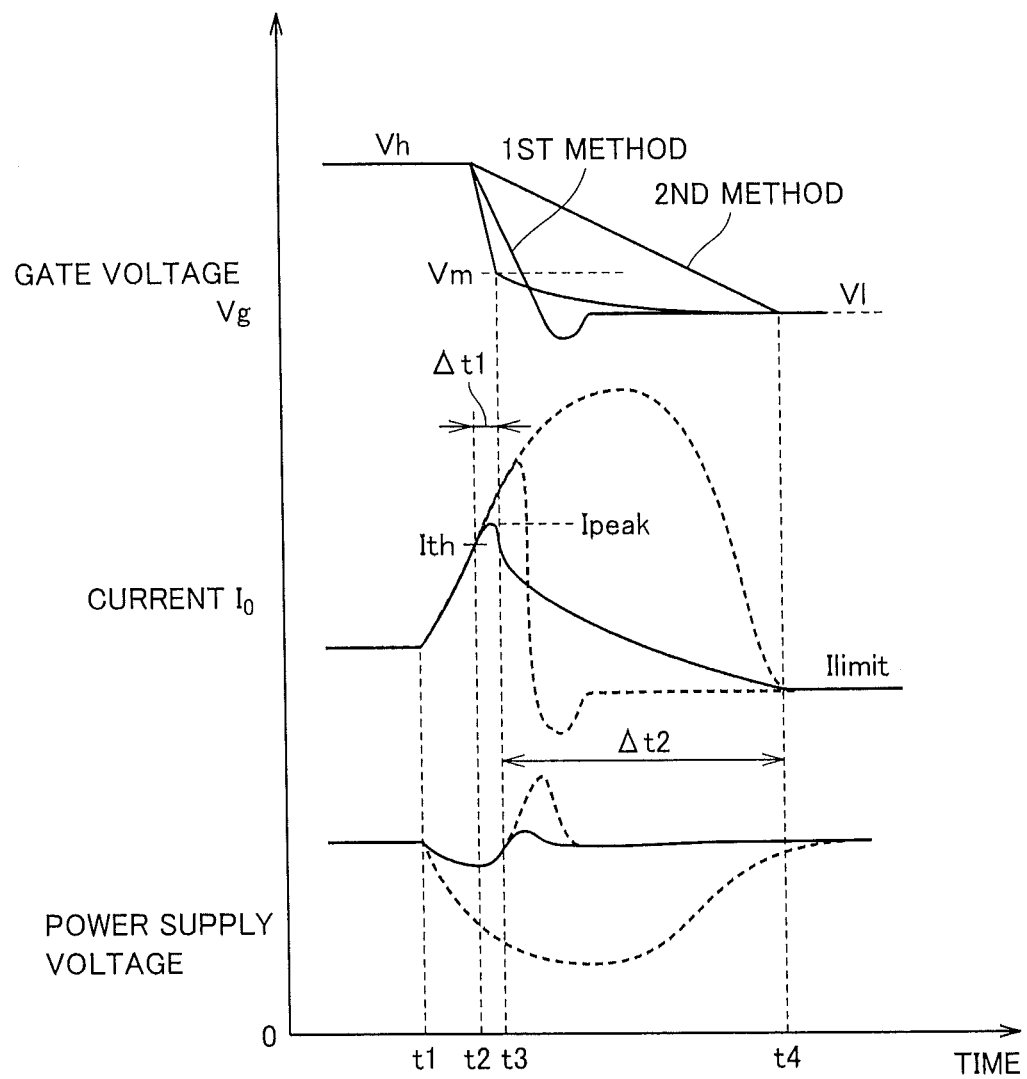
FIG. 23 is a diagram of waveforms illustrating current limitation in accordance with the second embodiment.

FIG. 23 is a diagram of waveforms illustrating current limitation in accordance with the second embodiment. Referring to FIG. 23, time t1 to t4 correspond to time t1 to t4 shown in FIGS. 21 and 22. In the second embodiment of the present invention, when current $I_0$ reaches the threshold current Ith (time t2), gate voltage dropping unit 51 once lowers gate voltage Vg from voltage Vh to voltage Vm (third voltage). Thereafter, gate voltage dropping unit 52 lowers gate voltage Vg from Vm to V1. The voltage Vm is between voltages Vh and V1. The time rate of change of gate voltage Vg when gate voltage Vg changes from voltage Vh to voltage Vm is higher than the time rate of change of gate voltage Vg when gate voltage Vg changes from voltage Vm to voltage V1. Specifically, gate voltage Vg changes sharply from Vh to Vm, and thereafter, gate voltage Vg changes slowly from Vm to V1.

According to the second and third exemplary configurations shown in FIG. 20, by turning on the switch (transistor 42B, 42C), a current flows through the diodes (or diode-connected N-channel transistors). Thus, the gate voltage Vg can sharply be lowered from voltage Vh to voltage Vm. Thus, the time period Δt1 can be made short. Since the time period Δt1 becomes shorter, current $I_0$ starts to decrease earlier than in the first and second methods. As a result, the peak current Ipeak can be lowered, and the time period in which a large current flows can be made shorter. Thus, drop of power supply voltage can be made smaller.

On the other hand, once the gate voltage Vg lowers to the voltage Vm, gate voltage dropping unit 52 lowers gate voltage Vg. Here, the gate voltage Vg is determined by the balance between the current output from charge pump 50 and the current flowing through resistive element 57 (current drawn by resistive element 57). Since the gate voltage Vg lowers moderately from Vm to V1 because of gate voltage dropping unit 52, the current $I_0$ also lowers moderately and reaches limit current Ilimit. Since the current $I_0$ decreases moderately, increase of power supply voltage can be made smaller even in the case of over shoot of power supply voltage.

As described above, by the second embodiment of the present invention, change in power supply voltage at the time of over-current detection and current limitation can be reduced. Thus, damage to circuitry (MOS transistor 15, load 200 and other ICs) arranged on the power supply line connected to sub power supply 2 can be prevented.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A high side switch circuit comprising;
an input terminal for receiving a current supplied from a power supply;
an output terminal for supplying said current to a load;
a first switch electrically connected between said input terminal and said output terminal;
a resistive element including a first terminal electrically connected to said input terminal and a second terminal electrically connected to said output terminal; and
a sensor circuit receiving a detection voltage generated at said resistive element as said current flows between said input terminal and said output terminal, for sensing that said current is an over-current, when said current reaches an over-current level and said detection voltage exceeds a threshold voltage,
said sensor circuit including:
an adjustment circuit for adjusting in advance said detection voltage such that said detection voltage exceeds said threshold value if said current is at an over-current level; and a comparator for comparing said detection voltage with said threshold voltage,
wherein the adjustment circuit is configured to adjust offset of an input voltage of said comparator, for adjusting said detection voltage,
wherein said comparator includes:
  a differential unit for changing its output voltage, in accordance with a voltage difference between a voltage at said first terminal of said resistive element and a voltage at said second terminal of said resistive element, and
  a plurality of transistors, connected in parallel with said differential unit, for changing relation between said voltage difference and said output voltage, by adjusting current flowing through said differential unit; and
wherein said adjustment circuit includes a fuse resistor connected to a corresponding one of said plurality of transistors.

2. An electronic device, comprising:
a power supply for supplying a current to a load; and
an interface circuit including a circuit board on which the high side switch according to claim 1 is mounted, said interface circuit being for connecting said power supply and said load.

3. The high side switch circuit according to claim 1, wherein
said comparator includes:
  a pair of nodes,
  a differential unit for changing output voltages at said pair of nodes, respectively, in accordance with a voltage difference between a voltage at said first terminal of said resistive element and a voltage at said second terminal of said resistive element,
  a first plurality of transistors connected to one of said pair of nodes, the first transistors being connected in parallel with each other, and
  a second plurality of transistors each connected to the other of said pair of nodes, the second transistors being connected in parallel with each other,
said adjustment circuit includes:
  a first fuse resistor connected to at least one of said first plurality of transistors, and
  a second fuse resistor connected to at least one of said second plurality of transistors.

4. A high side switch circuit comprising:
an input terminal for receiving a current supplied from a power supply;
an output terminal for supplying said current to a load;
a first switch electrically connected between said input terminal and said output terminal;
a resistive element including a first terminal electrically connected to said input terminal and a second terminal electrically connected to said output terminal;
a sensor circuit receiving a detection voltage generated at said resistive element as said current flows between said input terminal and said output terminal, for sensing that said current is an over-current, when said current reaches an over-current level and said detection voltage exceeds a threshold voltage, said sensor circuit including an adjustment circuit for adjusting in advance said detection voltage such that said detection voltage exceeds said threshold value if said current is at an over-current level;
a pad connected to said second terminal, allowing measurement of a voltage at said second terminal of said resistive element by a measurement device;
a second switch arranged between said second terminal of said resistive element and said output terminal; and
a switch control unit setting both said first and second switches on when said current is supplied from said power supply to said load, and setting both said first and second switches off when the measurement device measures the voltage at said second terminal.

5. An electronic device, comprising:
a power supply for supplying a current to a load and an interface circuit including a circuit board on which the high side switch according to claim 4 is mounted,
said interface circuit being for connecting said power supply and said load.

6. The high side switch circuit according to claim 4, further comprising:
a pad connected to said second terminal, allowing measurement of a voltage at said second terminal of said resistive element by attaching a measurement device,
a second switch arranged between said second terminal of said resistive element and said output terminal; and
a switch control unit setting both said first and second switches on when said current is supplied from said power supply to said load, and setting both said first and second switches off when the measurement device measures the voltage at said second terminal.

7. An interface circuit for supplying a current from a power supply to a load comprising a circuit board on which the high side switch according to claim 4 is mounted.

8. An interface circuit for supplying a current from a power supply to a load, comprising:
a circuit board on which the high side switch according to claim 1 is mounted.

9. A high side switch circuit, comprising:
an input terminal for receiving a current supplied from a power supply;
an output terminal for supplying said current to a load;
a transistor electrically connected between said input terminal and said output terminal;
an over-current sensor unit sensing flow of over-current through said transistor; and
a current limiting circuit, lowering, when said over-current is detected by said over-current sensor unit, control voltage of said transistor from a first voltage for setting said transistor to a fully on state to a second voltage for setting said transistor to an incompletely on state, to limit current flowing through said transistor,
said current limiting circuit including
first and second voltage dropping circuits connected in parallel with a control electrode of said transistor for lowering said control voltage,
said first voltage dropping circuit lowering said control voltage from said first voltage to a third voltage between said first and second voltages at a first time rate of change,
said second voltage dropping circuit lowering, after said control voltage reached said third voltage, said control voltage from said third voltage to said second voltage at a second time rate of change, and
said first time rate of change being higher than said second time rate of change.

10. The high side switch circuit according to claim 9, further comprising
a charge pump boosting a voltage applied to said input terminal and thereby applying said first voltage to the control electrode of said transistor, and stopped by an output of said over-current sensor unit, wherein
said first voltage dropping circuit includes a first switch connected to at least one of a ground node and the control electrode of said transistor, turning on in response to an output of said over-current sensor unit, and a constant voltage circuit electrically connected between said ground node and said control electrode of said transistor through said first switch, thereby to apply said third voltage to said control electrode, and said second voltage dropping circuit includes a resistive element for causing a current to flow from a node between said charge pump and said control electrode to said ground node, and a second switch turned on by an output of said over-current sensor unit, for forming a current path from said node to said ground node through said resistive element.

11. The high side switch circuit according to claim 10, wherein said constant voltage circuit includes at least one diode arranged to cause a forward current to flow in a direction from said control electrode of said transistor to said ground node.

12. The high side switch circuit according to claim 10, wherein said constant voltage circuit includes at least one diode-connected transistor arranged to cause a forward current to flow in a direction from said control electrode of said transistor to said ground node.

13. An interface circuit for supplying a current from a power supply to a load, comprising:

a circuit board; and a high side switch circuit mounted on said circuit board, said high side switch circuit including an input terminal for receiving a current supplied from the power supply, an output terminal for supplying said current to the load, a transistor electrically connected between said input terminal and said output terminal, an over-current sensor unit sensing flow of over-current through said transistor, and a current limiting circuit, lowering, when said over-current is detected by said over-current sensor unit, control voltage of said transistor from a first voltage for setting said transistor to a fully on state to a second voltage for setting said transistor to an incompletely on state, to limit current flowing through said transistor, said current limiting circuit including first and second voltage dropping circuits connected in parallel with a control electrode of said transistor for lowering said control voltage, said first voltage dropping circuit lowering said control voltage from said first voltage to a third voltage between said first and second voltages at a first time rate of change, said second voltage dropping circuit lowering, after said control voltage reached said third voltage, said control voltage from said third voltage to said second voltage at a second time rate of change, and said first time rate of change being higher than said second time rate of change.

14. An electronic device, comprising:

a power supply for supplying a current to a load; and an interface circuit for connecting said power supply and said load, said interface circuit including a circuit board, and a high side switch circuit mounted on said circuit board, said high side switch circuit including an input terminal for receiving a current supplied from the power supply, an output terminal for supplying said current to the load, a transistor electrically connected between said input terminal and said output terminal, an over-current sensor unit sensing flow of over-current through said transistor, and a current limiting circuit, lowering, when said over-current is detected by said over-current sensor unit, control voltage of said transistor from a first voltage for setting said transistor to a fully on state to a second voltage for setting said transistor to an incompletely on state, to limit current flowing through said transistor, said current limiting circuit including first and second voltage dropping circuits connected in parallel with a control electrode of said transistor for lowering said control voltage, said first voltage dropping circuit lowering said control voltage from said first voltage to a third voltage between said first and second voltages at a first time rate of change, said second voltage dropping circuit lowering, after said control voltage reached said third voltage, said control voltage from said third voltage to said second voltage at a second time rate of change, and said first time rate of change being higher than said second time rate of change.

15. A high side switch circuit, comprising:

an input terminal for receiving a current supplied from a power supply;

an output terminal for supplying said current to a load;

a transistor electrically connected between said input terminal and said output terminal;

an over-current sensor unit sensing flow of over-current through said transistor; and a current limiting circuit, lowering, when said over-current is detected by said over-current sensor unit, control voltage of said transistor from a first voltage for setting said transistor to a fully on state to a second voltage for setting said transistor to an incompletely on state, to limit current flowing through said transistor, said current limiting circuit including:

a voltage dropping circuits connected in parallel with a control electrode of said transistor for lowering said control voltage, said voltage dropping circuit lowering said control voltage from said first voltage to a third voltage between said first and second voltages at a first time rate of change, and lowering, after said control voltage reached said third voltage, said control voltage from said third voltage to said second voltage at a second time rate of change, and said first time rate of change being higher than said second time rate of change.

* * * * *